(12) United States Patent
Kim et al.

(10) Patent No.: US 12,543,400 B2
(45) Date of Patent: Feb. 3, 2026

(54) SOLAR CELL AND MANUFACTURING METHOD THEREFOR

(71) Applicant: Trina Solar Co., Ltd., Changzhou (CN)

(72) Inventors: Sungjin Kim, Seoul (KR); Juhwa Cheong, Seoul (KR); Hyungwook Choi, Seoul (KR); Wonjae Chang, Seoul (KR)

(73) Assignee: Trina Solar Co., Ltd., Changzhou (CN)

( * ) Notice: Subject to any disclaimer, the term of this patent is extended or adjusted under 35 U.S.C. 154(b) by 234 days.

(21) Appl. No.: 17/627,541

(22) PCT Filed: Apr. 9, 2020

(86) PCT No.: PCT/KR2020/004845
§ 371 (c)(1),
(2) Date: Jan. 14, 2022

(87) PCT Pub. No.: WO2021/015395
PCT Pub. Date: Jan. 28, 2021

(65) Prior Publication Data
US 2022/0262967 A1 Aug. 18, 2022

(30) Foreign Application Priority Data

Jul. 19, 2019 (KR) .................. 10-2019-0087537

(51) Int. Cl.
H10F 77/164 (2025.01)
H10F 71/00 (2025.01)
H10F 77/20 (2025.01)

(52) U.S. Cl.
CPC ....... H10F 77/164 (2025.01); H10F 71/1221 (2025.01); H10F 71/128 (2025.01); H10F 71/129 (2025.01); H10F 77/211 (2025.01)

(58) Field of Classification Search
None
See application file for complete search history.

(56) References Cited

U.S. PATENT DOCUMENTS

2008/0173347 A1* 7/2008 Korevaar .............. H01L 31/036
257/53
2009/0165855 A1* 7/2009 Sun .................. H01L 31/02167
136/265

FOREIGN PATENT DOCUMENTS

CN 105655427 A 6/2016
CN 108987490 A 12/2018
(Continued)

OTHER PUBLICATIONS

32th European Photovoltaic Solar Energy Conference, Proceedings of the 32th International Conference, Wip-Renewable Energies, Sylvensteinstr. 2 81369 Munich, Germany, Jul. 22, 2016 (Jul. 22, 2016), XP040679687, ISBN: 978-3-936338-41-6.

(Continued)

Primary Examiner — Dustin Q Dam
(74) Attorney, Agent, or Firm — Taft, Stettinius & Hollister LLP

(57) ABSTRACT

A solar cell according to an embodiment of the present disclosure includes a first passivation layer including a first aluminum oxide layer positioned on a first conductivity-type region composed of a polycrystalline silicon layer having an n-type conductivity and having hydrogen, and a first dielectric layer positioned on the first aluminum oxide layer and including a material different from the first aluminum oxide layer.

16 Claims, 12 Drawing Sheets

(56) References Cited

FOREIGN PATENT DOCUMENTS

| JP | 2004193350 | 7/2004 |
| JP | 2009164544 | 7/2009 |
| KR | 20130038307 | 4/2013 |
| KR | 10-2014-0110230 A | 9/2014 |
| KR | 20160010198 | 1/2016 |
| KR | 20160010198 A * | 1/2016 |
| KR | 20160052271 A | 5/2016 |
| KR | 20180116460 | 10/2018 |
| WO | 2013079800 A1 | 6/2013 |
| WO | 2013100085 A1 | 7/2013 |

OTHER PUBLICATIONS

Schmidt J et al: "Atomic-layer-deposited aluminum oxide for the surface passivation of high-efficiency Silicon solar cells", 2008 33rd IEEE Photovoltaic Specialists Conference :PVSC; San Diego, California, USA, May 11-16, 2008, IEEE, Piscataway, NJ, vol. 1-5, DOI: ISBN: 33, May 11, 2008 (May 11, 2008), pp. XP002628726, 10.1109/PVSC.2008.4922636 978-1-4244-1640-0.
Supplementary European Search Report, Application No. EP 20 84 4936, dated Jun. 8, 2023.
KR Office Action dated Oct. 24, 2022 for corresponding KR application No. 10-2021-0140207.
International Search Report in International Appln. No. PCT/KR2020/004845, dated Feb. 9, 2021, 5 pages (with English translation).
Chinese Patent Office, First Office Action issued in corresponding Application No. 202080052377.5, dated May 16, 2024, 14 pp.

* cited by examiner

[FIG. 1]
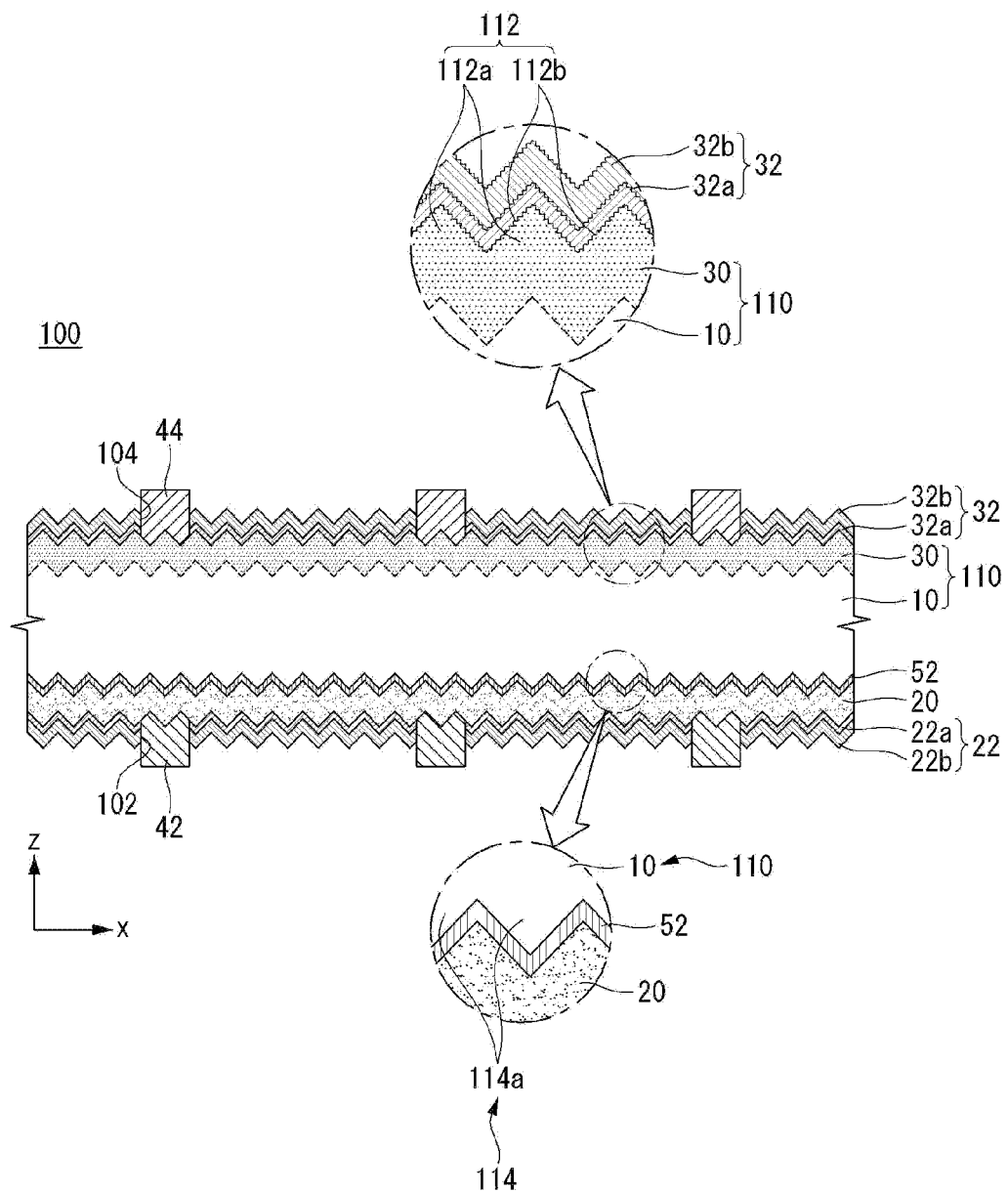

[FIG. 2]
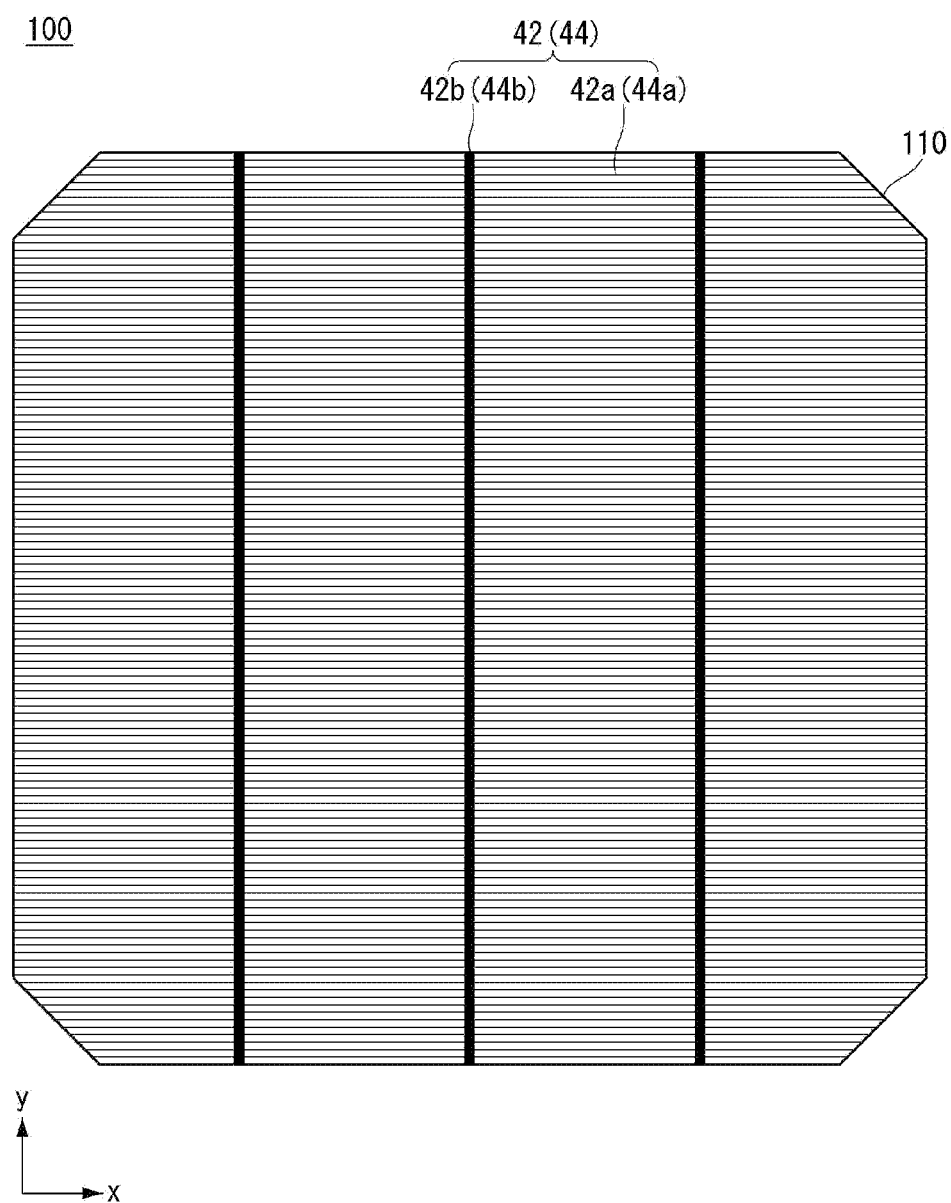

[FIG. 3]
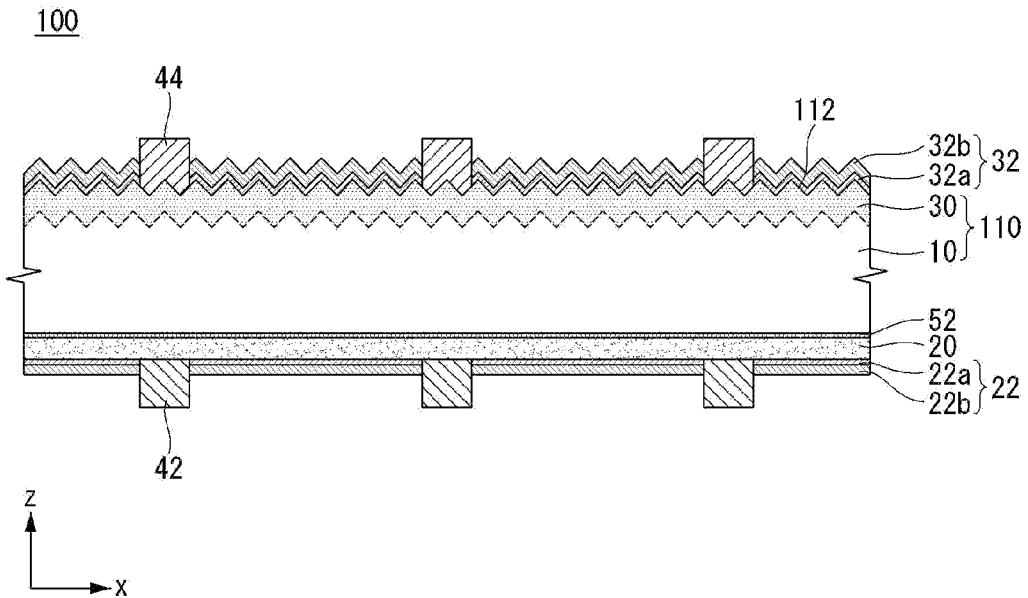
[FIG. 4]
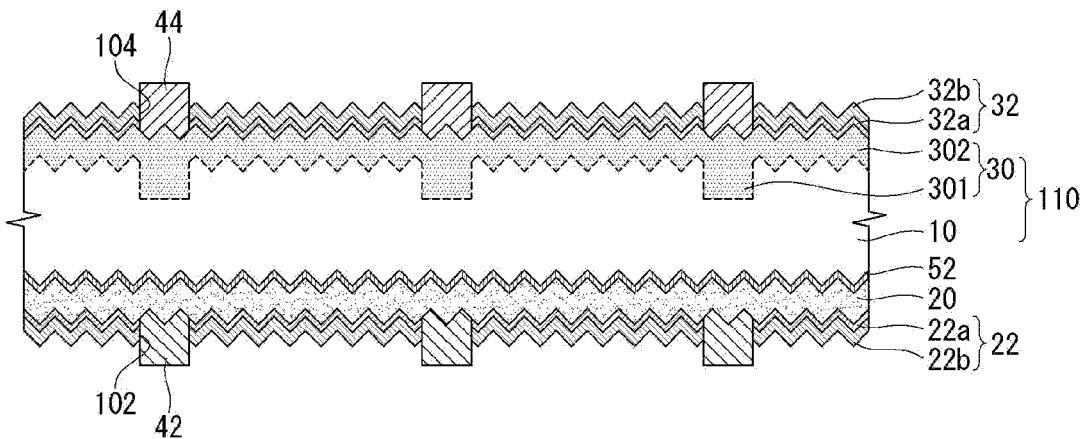
[FIG. 5]
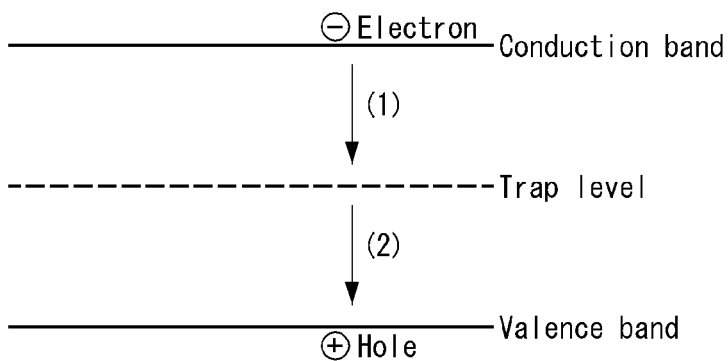

[FIG. 6]
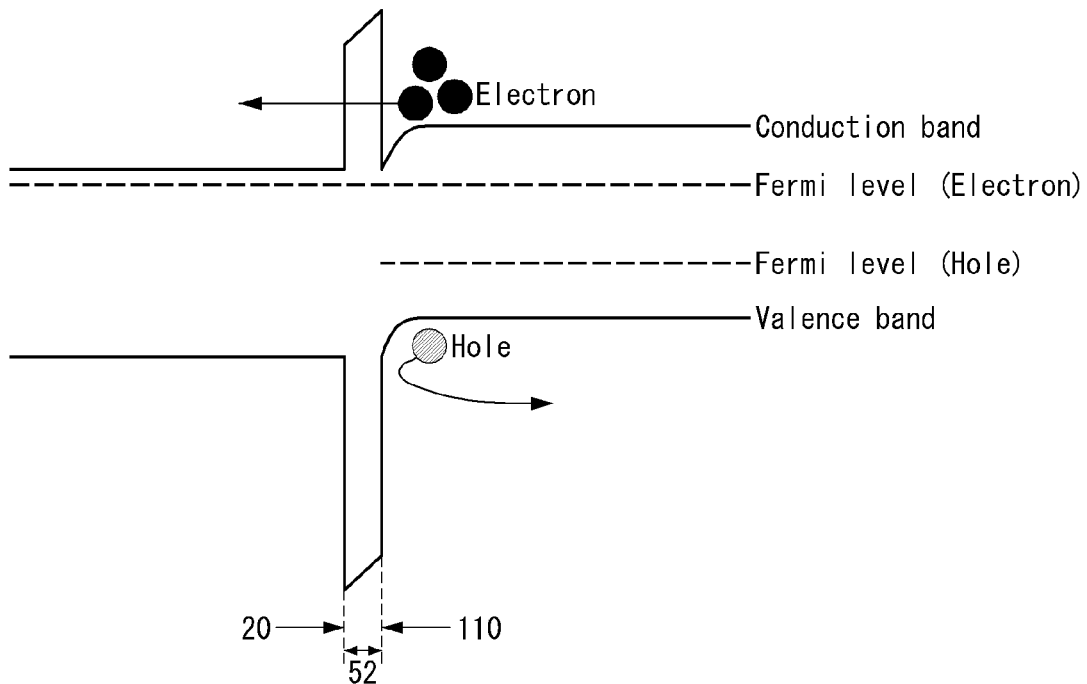
[FIG. 7]
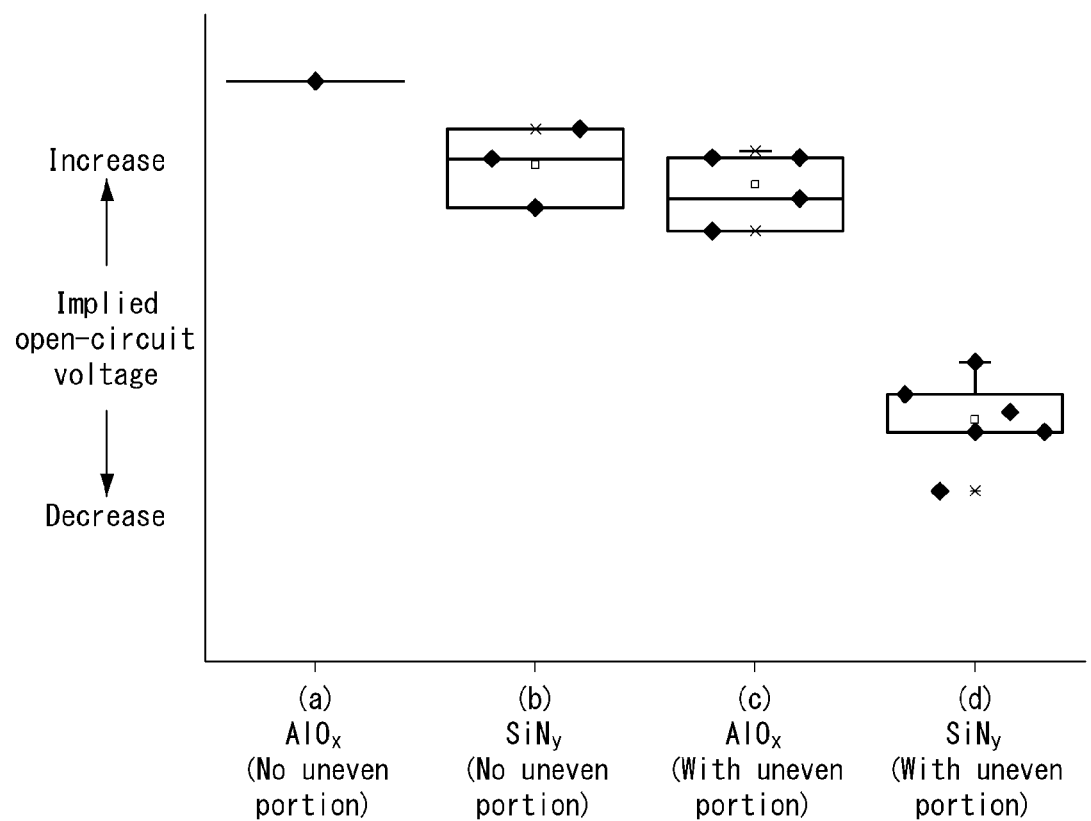

[FIG. 8]
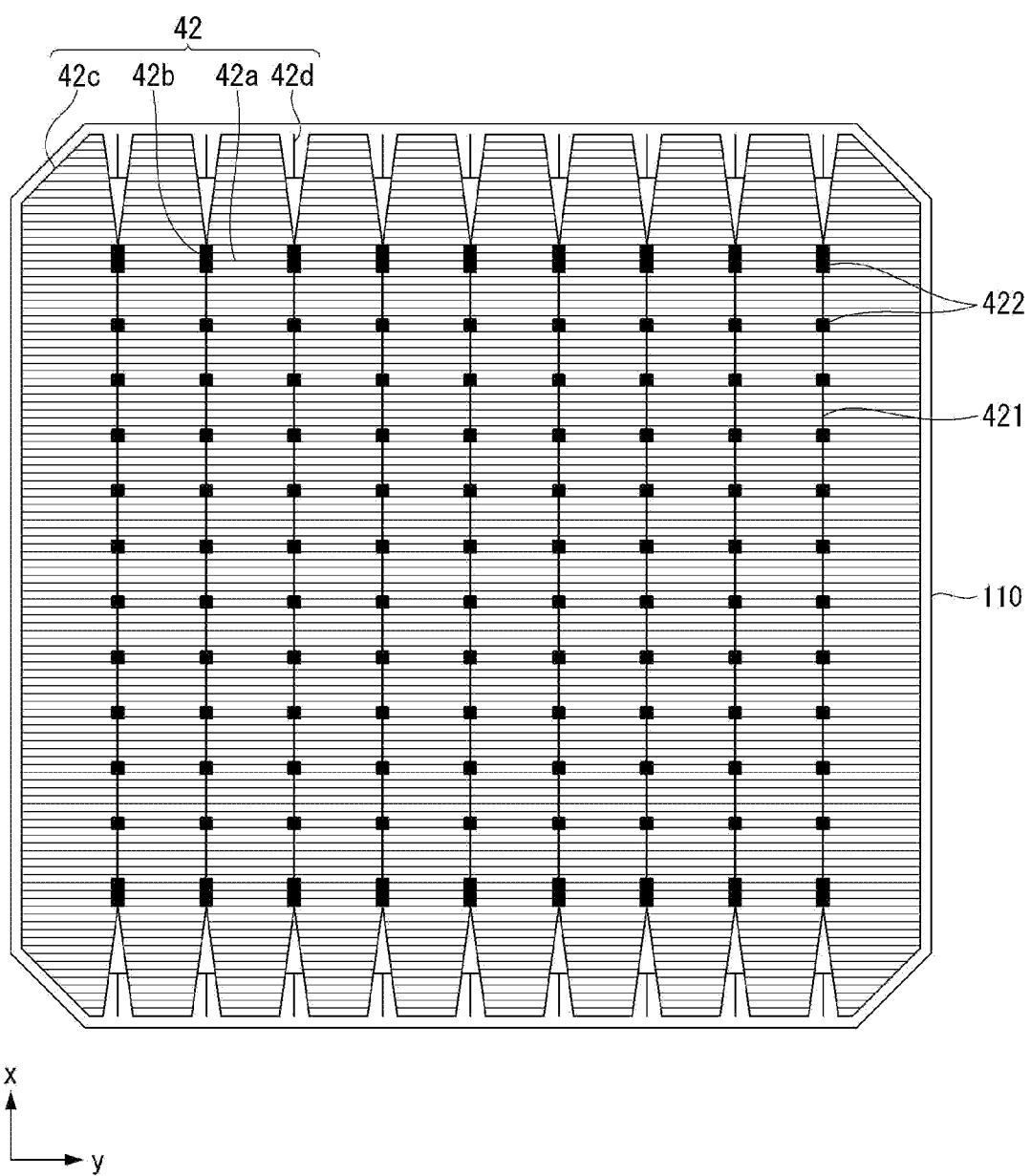

[FIG. 9]
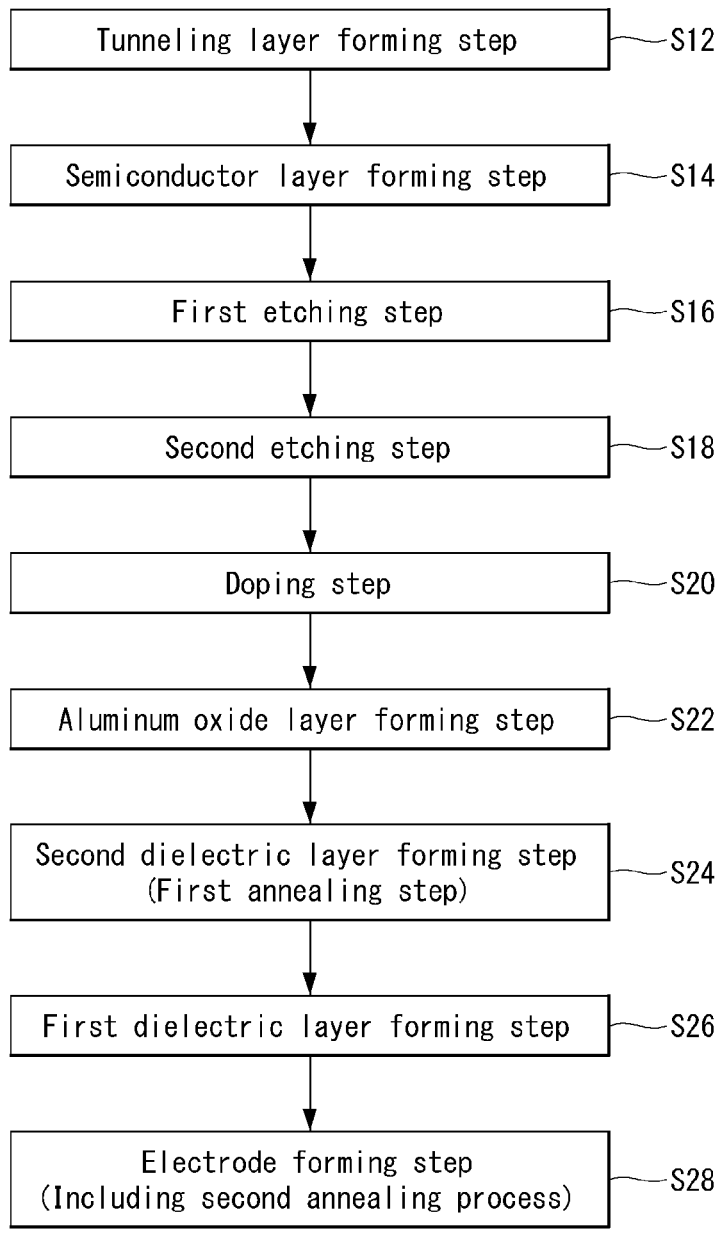
[FIG. 10A]
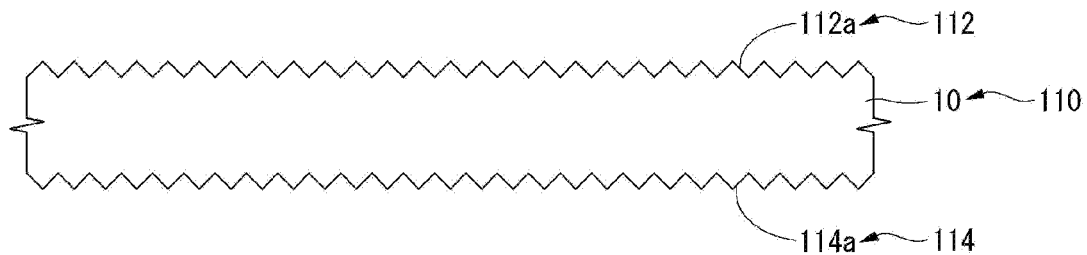

[FIG. 10B]
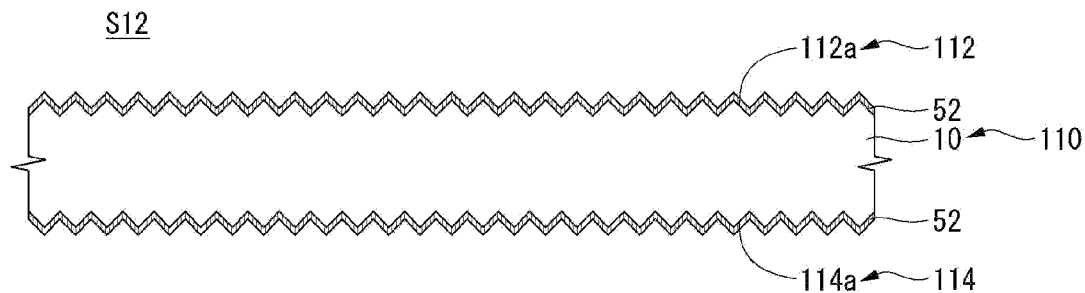
[FIG. 10C]
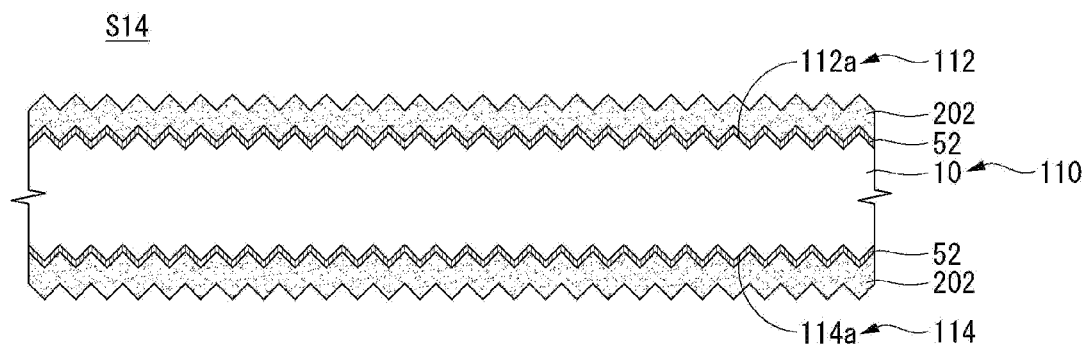
[FIG. 10D]
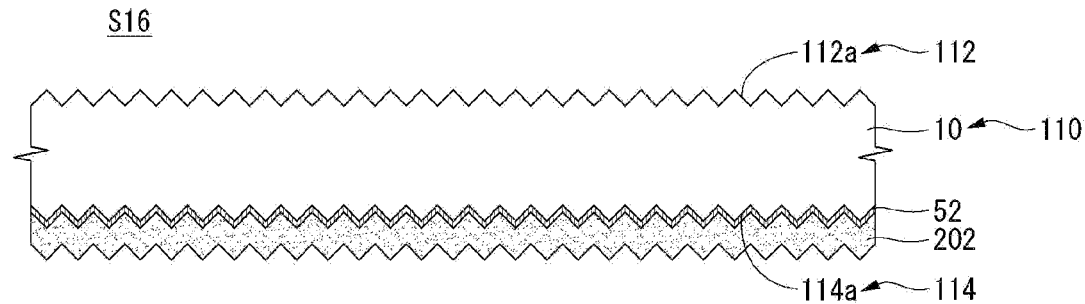

[FIG. 10E]
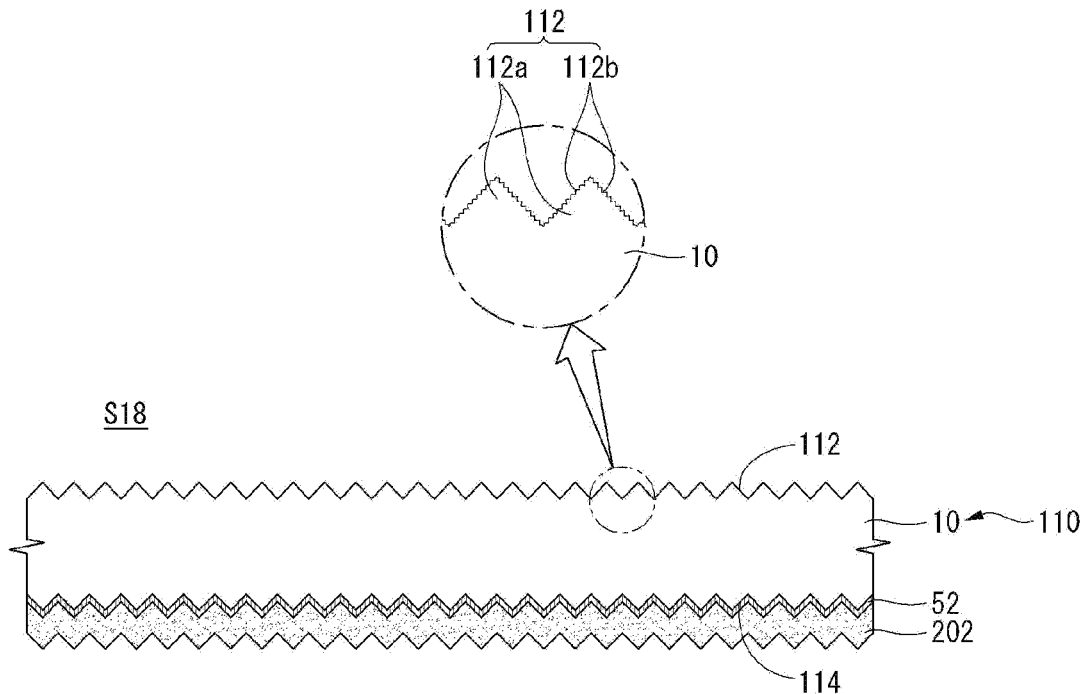
[FIG. 10F]
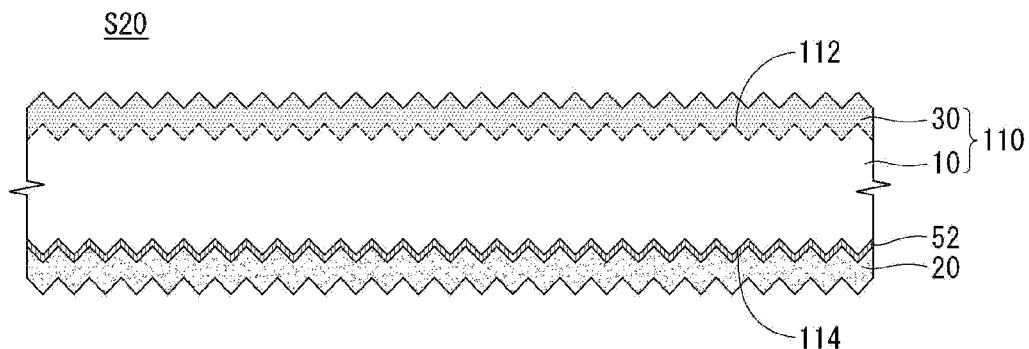
[FIG. 10G]
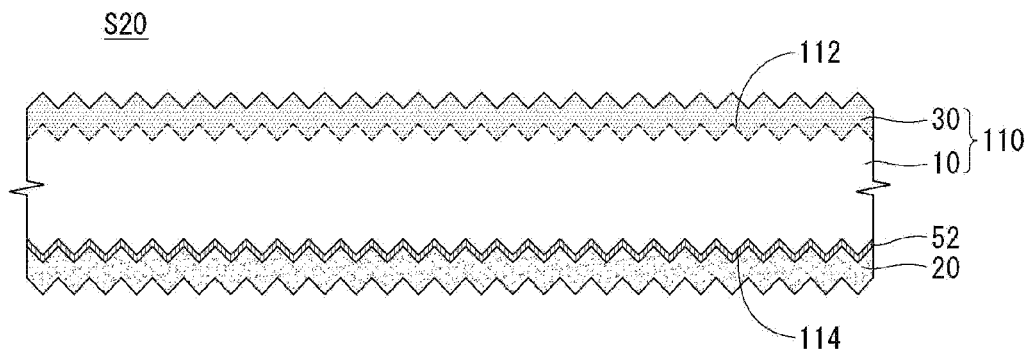

[FIG. 10H]
S24
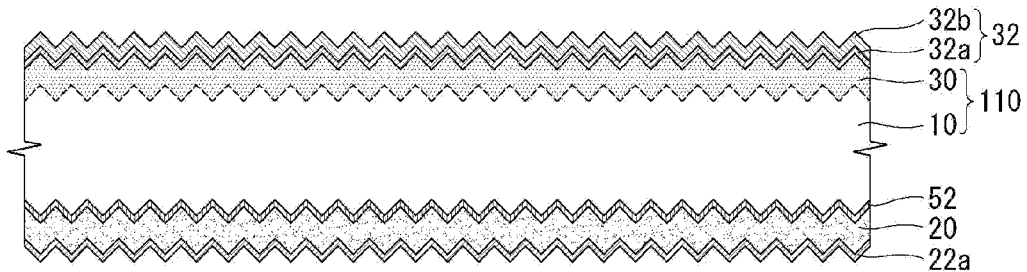
[FIG. 10I]
S26
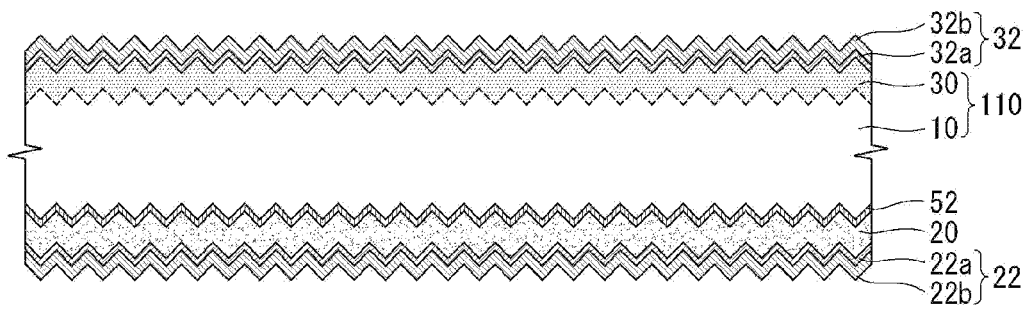
[FIG. 10J]
S28
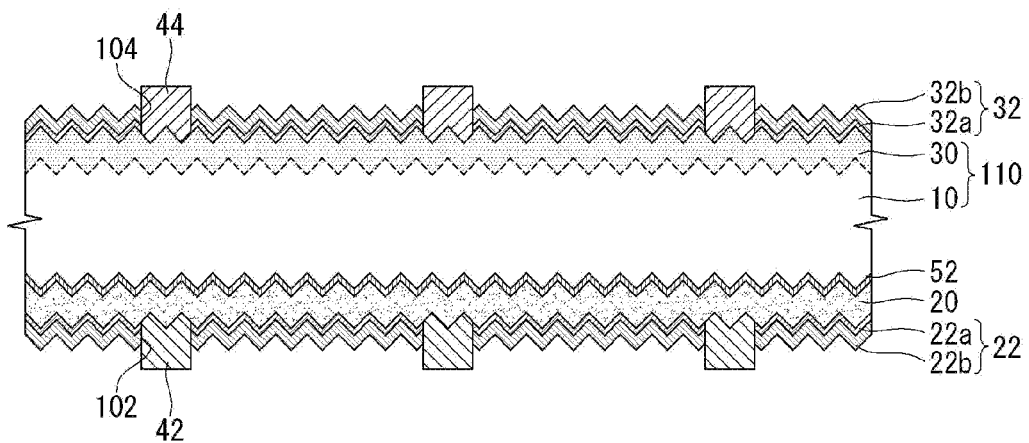

[FIG. 11]
(a) 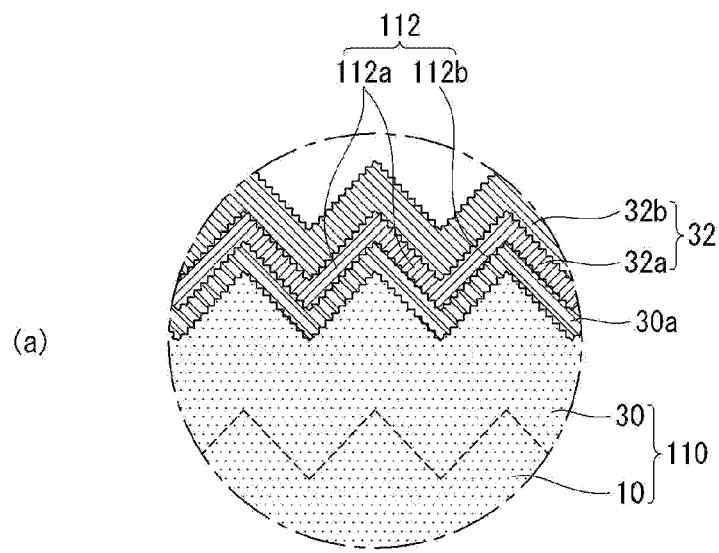
(b) 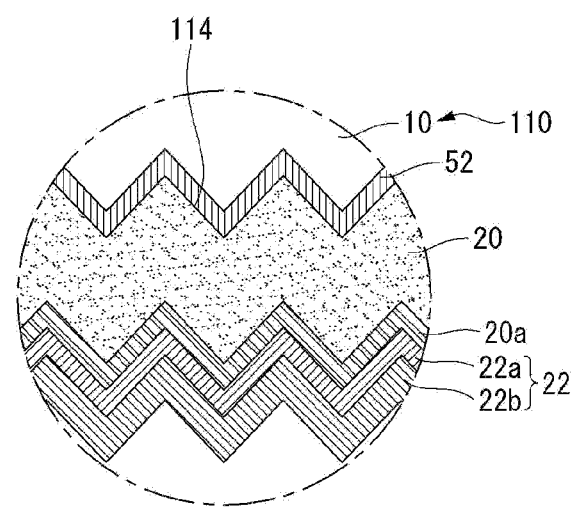

[FIG. 12]
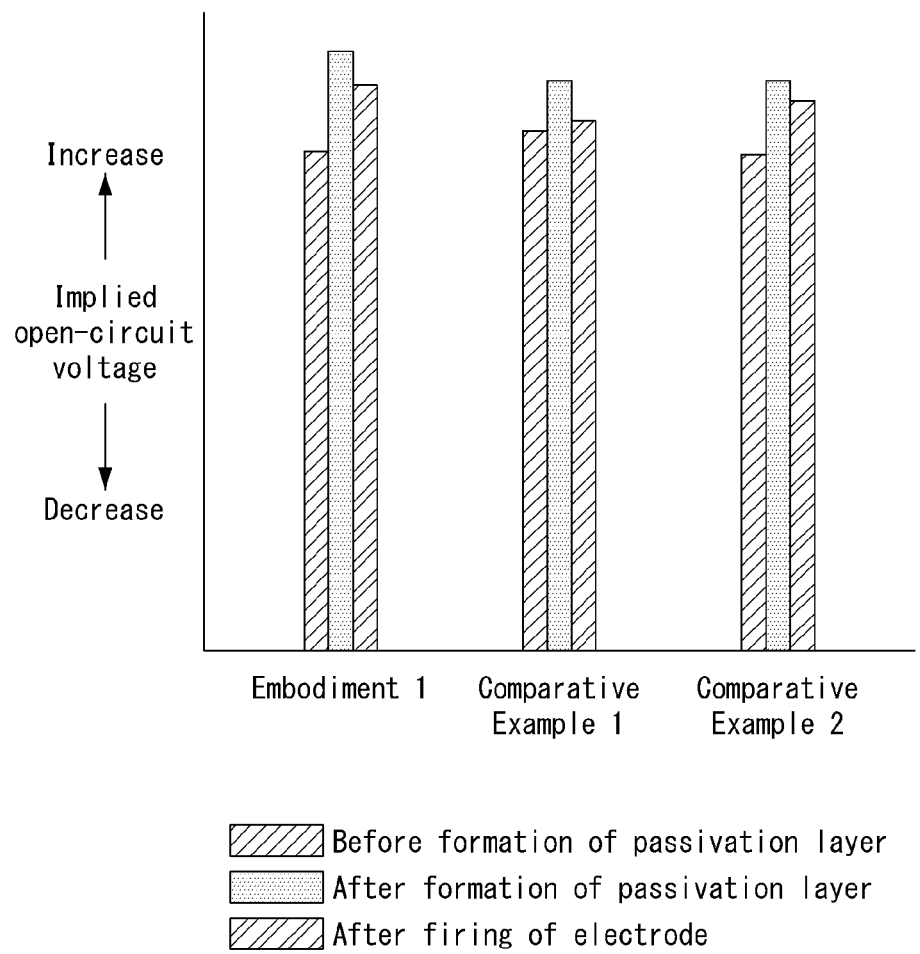
[FIG. 13]
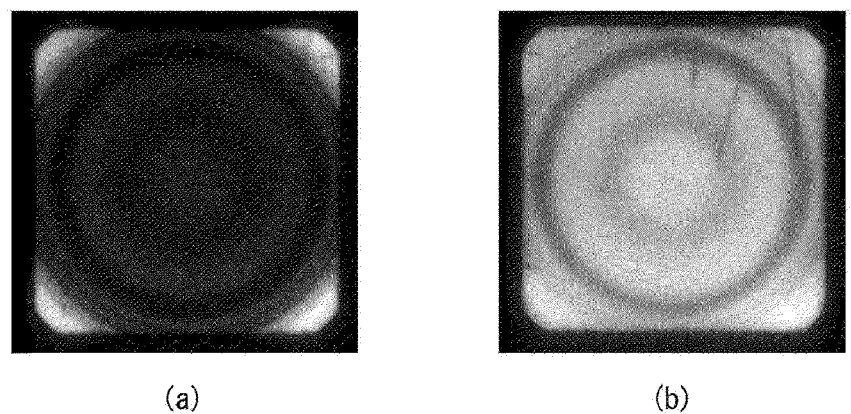
(a)　　　　　　　　　(b)

[FIG. 14]
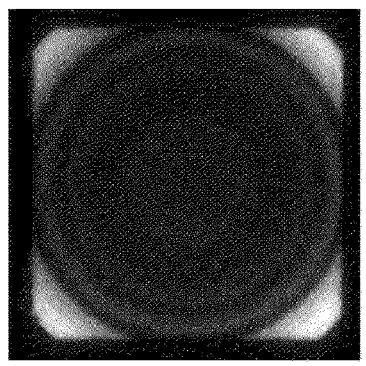 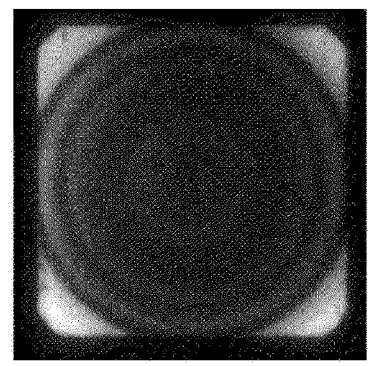
(a)  (b)

SOLAR CELL AND MANUFACTURING METHOD THEREFOR

CROSS-REFERENCE TO RELATED APPLICATIONS

This application is a National Stage application under 35 U.S.C. § 371 of International Application No. PCT/KR2020/004845, filed on Apr. 9, 2020, which claims the benefit of Korean Application No. 10-2019-0087537, filed on Jul. 19, 2019. The disclosures of the prior applications are incorporated by reference in their entirety.

TECHNICAL FIELD

The present disclosure relates to a solar cell and a method for manufacturing the same, and more specifically, to a solar cell with improved structure and process, and a method for manufacturing the same.

BACKGROUND ART

Solar cells in which a semiconductor layer having a dopant is formed on at least one surface of a semiconductor substrate and used as a conductive-type region has been proposed and used. Since the passivation characteristics of the solar cell has a great influence on the efficiency, various methods for improving the passivation characteristics of the solar cell have been proposed.

U.S. Pat. No. 9,716,204 discloses a method of manufacturing a solar cell in which first and second conductivity-type regions that collect different carriers are formed as semiconductor layers each having a dopant and hydrogen is implanted and passivated by a hydrogen gas atmosphere. However, when the first and second conductivity-type regions are formed of semiconductor layers each having a dopant, interfacial characteristics with the semiconductor substrate are deteriorated, which may have limitations in improving the efficiency of the solar cells. In addition, the hydrogen implantation effect may not be large when hydrogen is implanted by the hydrogen gas atmosphere. In addition, in a structure in which electrodes are provided on both sides, since the electrodes are formed entirely on the rear surface, material cost may increase, and a layer, structure, etc. for improving passivation characteristics on the rear surface is not provided.

DETAILED DESCRIPTION OF INVENTION

Technical Problem

An object of the present disclosure is to provide a solar cell capable of improving efficiency and a method for manufacturing the same.

More specifically, an object of the present disclosure is to provide a solar cell capable of improving passivation characteristics, reducing material cost, and simplifying a manufacturing process by improving a passivation structure, and a method for manufacturing the same.

In particular, an object of the present disclosure is to provide a solar cell capable of improving passivation characteristics, reducing material cost, and simplifying a manufacturing process by improving a passivation structure, and a method for manufacturing the same according to characteristics of a doped region and a semiconductor layer in a structure having the doped region composed of a part of a semiconductor substrate and the semiconductor layer formed on the semiconductor substrate.

Technical Solution

A solar cell according to an embodiment of the present disclosure includes a first passivation layer including a first aluminum oxide layer positioned on a first conductivity-type region composed of a polycrystalline silicon layer having an n-type conductivity and having hydrogen, and a first dielectric layer positioned on the first aluminum oxide layer and including a material different from the first aluminum oxide layer. In this case, the first conductivity-type region may be formed on a first surface of the semiconductor substrate. And a first electrode electrically connected to the first conductivity-type region passing through the first passivation layer may be further included.

The first dielectric layer may include silicon nitride, silicon oxide, or silicon oxynitride.

A thickness of the first aluminum oxide layer may be less than a thickness of the first dielectric layer.

A hydrogen content per unit volume in the first aluminum oxide layer may be greater than a hydrogen content per unit volume in the first dielectric layer.

The solar cell may further include a silicon oxide layer positioned between the first conductivity-type region and the first passivation layer.

The first surface of the semiconductor substrate may be a rear surface of the semiconductor substrate, the first electrode may include a plurality of finger electrodes extending in one direction, and the first dielectric layer may function as an anti-reflection film.

The solar cell may further include a second conductivity-type region formed at or on a second surface of the semiconductor substrate and having a p-type conductivity; a second passivation layer including a second aluminum oxide layer positioned on the second conductivity-type region, and a second dielectric layer positioned on the second aluminum oxide layer and including a material different from the second aluminum oxide layer; and a second electrode electrically connected to the second conductivity-type region passing through the second passivation layer.

The second conductivity-type region may be composed of a doped region constituting a part of the semiconductor substrate, and the first aluminum oxide layer and the second aluminum oxide layer may have the same material, composition, and thickness.

On the other hand, a solar cell according to an embodiment of the present disclosure includes a first conductivity-type region formed on a first surface of the semiconductor substrate and composed of a polycrystalline silicon layer having a first conductivity type and a second conductivity-type region formed on a second surface of the semiconductor substrate and composed of a doped region having a second conductivity type. Here, a first passivation layer positioned on the first conductivity-type region and a second passivation layer positioned on the second conductivity-type region may have the same stacked structure. For example, the first and second passivation layers each may include an aluminum oxide layer positioned on the first or second conductivity-type region and a dielectric layer positioned on the aluminum oxide layer and including a material different from the aluminum oxide layer. And the solar cell may include a first electrode electrically connected to the first conductivity-type region passing through the first passivation layer; and a second electrode electrically connected to the second conductivity-type region passing through the second passivation layer.

The dielectric layer may include silicon nitride, silicon oxide, or silicon oxynitride. A thickness of the aluminum oxide layer may be less than a thickness of the dielectric layer.

In addition, a method for manufacturing a solar cell according to an embodiment of the present disclosure includes forming a first conductivity-type region composed of a polycrystalline silicon layer having an n-type conductivity on a first surface of a semiconductor substrate; forming a passivation layer including forming a first passivation layer on the first conductivity-type region; and forming an electrode, which is forming a first electrode electrically connected to the first conductivity-type region passing through the first passivation layer. The forming the first passivation layer may include a process of forming a first aluminum oxide layer having hydrogen on the first conductivity-type region, and a process of forming a first dielectric layer positioned on the first aluminum oxide layer and including a material different from the first aluminum oxide layer.

Hydrogen included in the first aluminum oxide layer may be implanted into at least one of the first conductivity-type region and the semiconductor substrate by an annealing process performed in at least one of the forming the passivation layer and the forming the electrode.

The method may further include, before the forming the passivation layer, forming a second conductivity-type region at or on a second surface of the semiconductor substrate. The forming the passivation layer may further include forming a second passivation layer on the second conductivity-type region. The forming the second passivation layer may include a process of forming a second aluminum oxide layer on the second conductivity-type region, and a process of forming a second dielectric layer positioned on the second aluminum oxide layer and including a material different from the second aluminum oxide layer.

The process of forming the first aluminum oxide layer and the process of forming the second aluminum oxide layer may be performed together by the same process.

In the forming the passivation layer, the process of the forming the first dielectric layer may be performed after the process of forming the second dielectric layer is performed. The process of the forming the second dielectric layer may include a first annealing process in which hydrogen included in the first aluminum oxide layer is implanted into at least one of the first conductivity-type region and the semiconductor substrate.

The process of the forming the first dielectric layer, after performing the first annealing process, a deposition process of the first dielectric layer may be performed.

The process of forming the first aluminum oxide layer may be performed by an atomic layer deposition method or a plasma-induced chemical vapor deposition method.

The process of the forming the electrode may include a second annealing process in which hydrogen included in the first aluminum oxide layer is implanted into at least one of the first conductivity-type region and the semiconductor substrate. The first dielectric layer may function as a capping layer that prevents external diffusion of hydrogen in the second annealing process.

The first dielectric layer may include silicon nitride, silicon oxide, or silicon oxynitride.

The method may further include forming an uneven portion on the second surface of the semiconductor substrate by reactive ion etching.

Advantageous Effects

In the present embodiment, since a second conductivity-type region composed of a doped region and a first conductivity-type region composed of a semiconductor layer are provided, it is possible to minimize incident interference of light from the front surface of the semiconductor substrate and to minimize degradation of recombination characteristics due to the first conductivity-type region. Thereby, the characteristic of a solar cell can be improved.

In this structure, the first passivation layer positioned on the first conductivity-type region is provided with a first aluminum oxide layer and a first dielectric layer, so that it is possible to improve the hydrogen implantation effect and reliability by the first dielectric layer while implementing the hydrogen passivation effect by the first aluminum oxide layer. In addition, the second passivation layer positioned on the second conductivity-type region is provided with a second aluminum oxide layer and a second dielectric layer, so that it is possible to implement field effect passivation by the second aluminum oxide layer and improve reliability by the second dielectric layer.

As described above, the passivation characteristics and efficiency of the solar cell can be improved by configuring the first and second passivation layers with materials and stacked structures that consider all of the crystal structures, junction structures, and conductivity types of the first and second conductivity-type regions. In particular, although the first aluminum oxide layer and the second aluminum oxide layer implement different passivation in consideration of the crystal structure, junction structure, conductivity type, etc. of the first and second conductivity type regions, they may have the same material. In addition, the first and second dielectric layers may be formed of the same material thereon. The manufacturing process may be simplified by providing the first and second passivation layers having the same stacked structure as described above.

DESCRIPTION OF DRAWINGS

FIG. 1 is a cross-sectional view schematically illustrating a solar cell according to an embodiment of the present disclosure.

FIG. 2 is a schematic plan view of a solar cell shown in FIG. 1.

FIG. 3 is a cross-sectional view schematically illustrating a solar cell according to a modified example of the present disclosure.

FIG. 4 is a cross-sectional view schematically illustrating a solar cell according to another modified example of the present disclosure.

FIG. 5 is a schematic diagram for explaining a recombination model due to a defect and fixed charge passivation for preventing it.

FIG. 6 is a diagram illustrating a band diagram of a semiconductor substrate, a tunneling layer, and a first conductivity-type region in a solar cell according to an embodiment of the present disclosure.

FIG. 7 is a graph illustrating an implied open-circuit voltage according to a material of a passivation layer.

FIG. 8 is a cross-sectional view schematically illustrating a solar cell according to another modified example of the present disclosure.

FIG. 9 is a flowchart of a method of manufacturing a solar cell according to an embodiment of the present disclosure.

FIGS. 10A to 10J are cross-sectional views illustrating a method of manufacturing a solar cell according to an embodiment of the present disclosure.

FIG. 11 is a cross-sectional view schematically illustrating a part of a solar cell according to a modification of the present disclosure.

FIG. 12 is a graph illustrating results of measuring an implied open-circuit voltage of a solar cell according to Embodiment 1 and Comparative Examples 1 and 2.

FIG. 13(a) is a photoluminescence photograph after forming first and second conductivity-type regions in Embodiment 1, and FIG. 13(b) is a photoluminescence photograph after forming first and second passivation layers in Embodiment 1.

FIG. 14(a) is a photoluminescence photograph after forming first and second conductivity-type regions in Comparative Example 1, and FIG. 14(b) is a photoluminescence photograph after forming first and second passivation layers in Comparative Example 1.

MODE FOR INVENTION

Hereinafter, embodiments of the present disclosure will be described in detail with reference to the accompanying drawings. However, it is needless to say that the present disclosure is not limited to these embodiments and can be modified into various forms.

In the drawings, illustration of the parts not related to the description is omitted in order to clarify and briefly describe the present disclosure, and the same reference numerals are used for the same or very similar parts throughout the specification. In the drawings, the thickness, width, and the like are enlarged or reduced to make the explanation more clear, and the thickness, width, etc. of the present disclosure are not limited to those shown in the drawings.

When a part is referred to as "including" another part throughout the specification, it does not exclude other parts and may further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell and a manufacturing method thereof according to an embodiment of the present disclosure will be described in detail with reference to the accompanying drawings. In the present disclosure, the expression "first" or "second" is only used to distinguish from each other, and the present disclosure is not limited thereto.

FIG. 1 is a cross-sectional view schematically illustrating a solar cell according to an embodiment of the present disclosure, and FIG. 2 is a schematic plan view of a solar cell shown in FIG. 1.

Referring to FIGS. 1 and 2, a solar cell 100 according to the present embodiment includes a semiconductor substrate 110, a first conductivity-type region 20 formed on a first surface (e.g. a rear surface) of the semiconductor substrate 110 and composed of a polycrystalline silicon layer having a first conductivity type (e.g. n-type conductivity type), a first passivation layer 22 positioned on the first conductivity-type region 20, and a first electrode 42 electrically connected to the first conductivity-type region 20 passing through the first passivation layer 22. In addition, the solar cell 100 according to the present embodiment may include a second conductivity type region 30 formed at or on a second surface (e.g. a front surface) of the semiconductor substrate 110 and having a second conductivity type (e.g. p-type conductivity), a second passivation layer 32 positioned on the second conductivity-type region 30, and a second electrode 44 electrically connected to the second conductivity-type region 30 passing through the second passivation layer 32. This will be described in more detail.

The semiconductor substrate 110 may be formed of a crystalline semiconductor. For example, the semiconductor substrate 110 may be formed of a single crystal semiconductor or polycrystalline semiconductor (e.g. single crystal silicon or polycrystalline silicon). In particular, the semiconductor substrate 110 may be formed of a single crystal semiconductor (e.g. a single crystal semiconductor wafer, more specifically, a single crystal silicon wafer). As described above, when the semiconductor substrate 110 is formed of a single crystal semiconductor (e.g. single crystal silicon), the solar cell 100 constitutes a single crystal semiconductor solar cell (e.g. single crystal silicon solar cell). As described above, the solar cell 100 based on the semiconductor substrate 110 formed of a crystalline semiconductor having high crystallinity and fewer defects may have excellent electrical characteristics.

The semiconductor substrate 110 may include the base region 10 having the first or second conductivity type by including a first or second conductivity-type dopant at a relatively low doping concentration. The first and second conductivity-type regions 20 and 30 have a higher doping concentration than the base region 10 having a conductivity type different from that of the base region 10, or having the same conductivity type as the base region 10. For example, the base region 10 may have a first conductivity type (e.g. an n-type conductivity type).

The front surface and/or the rear surface of the semiconductor substrate 110 may be textured to have unevenness. In the present embodiment, the front surface and/or the rear surface of the semiconductor substrate 110 may have unevenness 112 and 114 formed by texturing. When the unevenness 112 and 114 are formed on the front and/or rear surfaces of the semiconductor substrate 110 by such texturing, reflectivity of light incident through the front and/or rear surfaces of the semiconductor substrate 110 may be reduced. Accordingly, the amount of light reaching the pn junction formed by the base region 10 and the second conductivity-type region 30 can be increased, thereby minimizing light loss.

More specifically, in the present embodiment, the unevenness 112 and 114 may include a first unevenness 112 formed on the front surface (front side surface) of the semiconductor substrate 110 and a second unevenness 114 formed on the rear surface (rear side surface) of the semiconductor substrate 110. Accordingly, both reflection of light incident to the front and rear surfaces of the semiconductor substrate 110 may be prevented, so that light loss in the solar cell 100 having a bi-facial structure as in the present embodiment can be effectively reduced. However, the present disclosure is not limited thereto. As a modification, as shown in FIG. 3, the first unevenness 112 may be provided on the front surface of the semiconductor substrate 110, but the second unevenness 114 may not be provided on the rear surface of the semiconductor substrate 110. As another modification, the first unevenness 112 may not be provided on the front surface of the semiconductor substrate 110, but the second unevenness 114 may be provided on the rear surface of the semiconductor substrate 110. As another modification, the first unevenness 112 and the second unevenness 114 may not be provided on the semiconductor substrate 110.

The first unevenness 112 positioned on the front surface of the semiconductor substrate 110 may include a first uneven portion 112a and a second uneven portion 112b to minimize optical loss. The second uneven portion 112b may be formed on the first uneven portion 112a, more specifically, on the outer surface constituting the first uneven portion 112a and may have a smaller size than the corresponding first uneven portion 112a. Accordingly, the average size of the second uneven portion 112b may be smaller than the average size of the first uneven portion 112a, and at least one, for example, a plurality of second uneven portions 112b may be positioned on each outer surface constituting the first uneven portion 112a. The first uneven portion 112a and the second uneven portion 112b may be formed by different methods.

The outer surface of the first uneven portion 112a may be composed of specific crystal planes. For example, the first uneven portion 112a may have an approximate pyramidal shape formed by four outer surfaces that are (111) planes. The first uneven portion 112a may be formed by anisotropic etching by wet etching. When the first uneven portion 112a is formed by wet etching, the first uneven portion 112a may be formed within a short time by a simple process. A process of forming the first uneven portion 112a by wet etching will be described later in more detail.

The second uneven portion 112b may be formed on the outer surface (e.g. (111) plane) of the first uneven portion 112a while having a fine size. The second uneven portion 112b may have a pointed end, but the present disclosure is not limited thereto, and the second uneven portion 112b may have a rounded end. An average size of the second uneven portion 112b may be smaller than an average size of the first uneven portion 112a. In addition, a size deviation of the second uneven portion 112b may be smaller than a size deviation of the first uneven portion 112a. This is also because the average size of the second uneven portion 112b is smaller, and also because the process of the second uneven portion 112b is performed based on isotropic etching. As described above, in the present embodiment, uniform and fine second uneven portion 112b is formed on the outer surface of the first uneven portion 112a. The second uneven portion 112b may be formed by isotropic etching by dry etching. As the dry etching, for example, reactive ion etching (IRE) may be used. According to the reactive ion etching, the second uneven portion 112b may be formed finely and uniformly.

In the present embodiment, the second unevenness 114 formed on the rear surface of the semiconductor substrate 110 may include a first uneven portion 114a. For the first uneven portion 114a of the second unevenness 114, the description of the first uneven portion 112a of the first unevenness 112 may be applied as it is, and a detailed description thereof will be omitted. As described above, when the second unevenness 114 of the semiconductor substrate 110 has only the first uneven portion 114a and has a different shape from the first unevenness 112 having the first and second uneven portions 112a and 112b, reflection from the front surface of the semiconductor substrate 110 having a large incident amount of light can be effectively prevented by the first unevenness 112, and the second unevenness 114 may have a simple structure, thereby simplifying the manufacturing process of the solar cell 100.

The present disclosure may not be limited to the shape, average size, and size deviation, etc. of the first uneven portion 112a, the second uneven portion 112b, and the first uneven portion 114a, and the shape, average size, size deviation, etc. of the first uneven portion 112a, the second uneven portion 112b, and the first uneven portion 114a may be variously deformed. In addition, the first unevenness 112 formed on the front surface of the semiconductor substrate 110 may not include at least one of the first uneven portion 112a and the second uneven portion 112b, or the second unevenness 114 may have unevenness other than the first uneven portion 114a, or in addition, the first unevenness 112 and the second unevenness 114 may have different shapes, shapes, and the like.

One region having a conductivity type different from that of the base region 10 among the first and second conductivity-type regions 20 and 30 constitutes at least a part of an emitter region. The emitter region forms a pn junction with the base region 10 to generate carriers by photoelectric conversion. The other one having the same conductivity type as the base region 10 among the first and second conductivity-type regions 20 and 30 constitutes at least a part of a surface field region. The surface field region forms an electric field that prevents carriers from being lost by recombination on the surface of the semiconductor substrate 110.

In this case, various materials capable of representing n-type or p-type may be used as the first or second conductivity-type dopant. As the p-type dopant, group 3 elements such as boron (B), aluminum (Al), gallium (Ga), or indium (In) may be used, and as the n-type dopant, group 5 elements such as phosphorus (P), arsenic (As), bismuth (Bi), or antimony (Sb) may be used. For example, the p-type dopant may be boron (B) and the n-type dopant may be phosphorus (P).

For example, the base region 10 may be of the first conductivity type, the first conductivity type may be n-type and the second conductivity type may be p-type. Then, the second conductivity type region 30 forming the pn junction with the base region 10 has a p-type. When light is irradiated to these pn junctions, electrons generated by the photoelectric effect move toward the rear surface of the semiconductor substrate 110 and are collected by the first electrode 42, and holes move toward the front surface of the semiconductor substrate 110 and are collected by the second electrode 44. Thereby, electrical energy is generated. Then, the holes having a slower movement speed than the electrons may move to the front surface of the semiconductor substrate 110 instead of the rear surface, so that conversion efficiency may be improved. However, the present disclosure is not limited thereto, and it is also possible for the base region 10 to have a second conductivity type.

The second conductivity-type region 30 having the second conductivity type opposite to that of the base region 10 may be formed on the front surface side of the semiconductor substrate 110. The second conductivity-type region 30 may form a pn junction with the base region 10 to constitute the emitter region that generates carriers by photoelectric conversion.

In the present embodiment, the second conductivity-type region 30 may be configured as a doped region constituting a part of the semiconductor substrate 110. Accordingly, the second conductivity-type region 30 may be formed of a crystalline semiconductor including the second conductivity-type dopant. For example, the second conductivity-type region 30 may be formed of a single crystal or polycrystalline semiconductor (e.g. single crystal or polycrystalline silicon) including the second conductivity-type dopant. In particular, the second conductivity-type region 30 may be formed of a single crystal semiconductor (e.g. a single crystal semiconductor wafer, more specifically, a single crystal silicon wafer) including the second conductivity-type dopant. As described above, when the second conductivity-type region 30 forms a part of the semiconductor substrate 110, bonding characteristics with the base region 10 may be improved.

In the present embodiment, the second conductivity-type region 30 composed of a doped region is formed entirely on the front surface side of the semiconductor substrate 110. Accordingly, a semiconductor layer having a different crystal structure from that of the semiconductor substrate 110 is not positioned on the front surface side of the semiconductor substrate 110. Since the semiconductor layer has low light transmittance, light loss may occur due to the semiconductor layer when the semiconductor layer is positioned on the semiconductor substrate 110. In the present embodiment, the second conductivity-type region 30 composed of the doped region is formed in the semiconductor substrate 110, so that it is possible to prevent a problem when the semiconductor layer is positioned on the front surface of the semiconductor substrate 110.

Although FIG. 1 illustrates that the second conductivity-type region 30 has a homogeneous structure having a uniform doping concentration as a whole, the present disclosure is not limited thereto. As a modification, as shown in FIG. 4, the second conductivity-type region 30 may have a selective structure. That is, the second conductivity-type region 30 may include a first region 301 formed in a portion corresponding to the second electrode 44 and having a low resistance or a high doping concentration of the second conductivity-type dopant, and a second region 302 positioned in the other portion and having a higher resistance or a lower doping concentration of the second conductivity-type dopant than the first region 301. In addition, the second conductivity-type region 30 may be a separate semiconductor layer having a different crystal structure from the semiconductor substrate 110 and/or positioned on the semiconductor substrate 110 and formed separately from the semiconductor substrate 110. Various other variations are possible.

A tunneling layer 52 may be formed on the rear surface of the semiconductor substrate 110. The tunneling layer 52 acts as a kind of barrier to electrons and holes, so that minority carriers do not pass through, and after the majority carriers are accumulated in a portion adjacent to the tunneling layer 52, only the majority carriers having a certain energy or more may pass through the tunneling layer 52. In this case, the majority carriers having energy above a certain level may easily pass through the tunneling layer 52 due to the tunneling effect. In addition, the tunneling layer 52 may serve as a diffusion barrier that prevents the dopant of the first conductivity-type region 20 from diffusing into the semiconductor substrate 110. The tunneling layer 52 may include various materials through which multiple carriers can be tunneled, and for example, the tunneling layer 52 may include oxides, nitrides, semiconductors, conductive polymers, and the like. For example, the tunneling layer 52 may include silicon oxide, silicon nitride, silicon oxynitride, intrinsic amorphous silicon, intrinsic polycrystalline silicon, or the like. In this case, the tunneling layer 52 may be entirely formed on the rear surface of the semiconductor substrate 110. Accordingly, it may be easily formed without separate patterning.

A thickness of the tunneling layer 52 may be smaller than a thickness of the first or second passivation layers 22 and 32 to sufficiently implement the tunneling effect. For example, the thickness of the tunneling layer 52 may be 10 nm or less, and may be 0.5 nm to 10 nm (more specifically, 0.5 nm to 5 nm, for example, 1 nm to 4 nm). When the thickness of the tunneling layer 52 exceeds 10 nm, tunneling does not occur smoothly and the solar cell 100 may not operate, and when the thickness of the tunneling layer 52 is less than 0.5 nm, it may be difficult to form the tunneling layer 52 of a desired quality. In order to further improve the tunneling effect, the thickness of the tunneling layer 52 may be 0.5 nm to 5 nm (more specifically, 1 nm to 4 nm). However, the present disclosure is not limited thereto, and the thickness of the tunneling layer 52 may have various values.

The first conductivity-type region 20 may be positioned on the tunneling layer 52. In this case, the first conductivity-type region 20 may include a semiconductor (e.g. silicon) including the same first conductivity type dopant as the base region 10. In the present embodiment, the first conductivity-type region 20 is formed on the semiconductor substrate 110 (more specifically, on the tunneling layer 52) separately from the semiconductor substrate 110, and is formed of a semiconductor layer doped with the first conductivity-type dopant. Accordingly, the first conductivity-type region 20 may be formed of a semiconductor layer having a different crystal structure from that of the semiconductor substrate 110 so as to be easily formed on the semiconductor substrate 110.

The first conductivity-type region 20 forms a rear electric field to prevent loss of carriers by recombination on the surface of the semiconductor substrate 110 (more precisely, the rear surface of the semiconductor substrate 110).

In the present embodiment, the first conductivity-type region 20 is entirely formed on the tunneling layer 52 on the rear surface of the semiconductor substrate 110. Since the first conductivity-type region 20 is formed on the tunneling layer 52 to reduce the doped region formed in the semiconductor substrate 110, it is possible to effectively prevent damage to the semiconductor substrate 110 and an increase in surface recombination caused by the doped region, which may occur when the doped region is formed. Accordingly, the open-circuit voltage of the solar cell 100 can be greatly improved by effectively preventing surface recombination. In addition, since the first conductivity-type region 20 is formed as a whole, a separate patterning process is not required.

The first passivation layer 22 is formed on the rear surface of the semiconductor substrate 110, more precisely, on the first conductivity-type region 20 positioned on the semiconductor substrate 110, and the first electrode 42 is electrically connected (e.g. contacted) to the first conductivity-type region 20 and is formed by passing through the first passivation layer 22 (i.e. through an opening 102). In addition, a second passivation layer 32 is formed on the front surface of the semiconductor substrate 110, more precisely, on the second conductivity-type region 30 formed in the semiconductor substrate 110, and the second electrode 44 is electrically connected (e.g. contacted) to the second conductivity-type region 30 and is formed by passing through the second passivation layer 32 (i.e. through the opening 104).

The first passivation layer 22 may be substantially formed entirely on the rear surface of the semiconductor substrate 110 except for the opening 102 corresponding to the first electrode 42. The second passivation layer 32 may be substantially formed entirely on the front surface of the semiconductor substrate 110 except for the opening 104 corresponding to the second electrode 44.

In the present embodiment, the first passivation layer 22 may be positioned on the first conductivity-type region 20, and may include a first aluminum oxide layer 22a having hydrogen, and a first dielectric layer 22b positioned on the first aluminum oxide layer 22a and including a different material from that of the first aluminum oxide layer 22a. The second passivation layer 32 may include a second aluminum oxide layer 32a positioned on the second conductivity-type region 30, and a second dielectric layer 32b positioned on the second aluminum oxide layer 32a and including a different material from that of the second aluminum oxide layer 32a.

Here, the first aluminum oxide layer 22a and the second aluminum oxide layer 32a are basically composed of aluminum oxide including aluminum and oxygen and perform different roles. This is because the first aluminum oxide layer 22a is positioned on the first conductivity-type region 20, which is a semiconductor layer (e.g. a polycrystalline semiconductor layer, particularly a polycrystalline semiconductor layer having an n-type conductivity), on the rear surface side of the semiconductor substrate 110, and the second aluminum oxide layer 32a is positioned on the second conductivity-type region 30 formed as a part of the semiconductor substrate 110 from the front surface side of the semiconductor substrate 110. More specifically, the first aluminum oxide layer 22a positioned adjacent to the first conductivity-type region 20 composed of the polycrystalline semiconductor layer (especially, an n-type polycrystalline semiconductor layer) may serve as a hydrogen implantation layer for implementing hydrogen passivation by implanting hydrogen into the semiconductor substrate 110 and/or the first conductivity type region 20. In addition, the second aluminum oxide layer 32a positioned adjacent to the semiconductor substrate 110 (especially, the p-type second conductivity-type region 30) may serve as a fixed charge passivation layer that prevents recombination using fixed charges. This will be described in more detail after the first dielectric layer 22b and the second dielectric layer 32b are described.

The first dielectric layer 22b positioned on the first aluminum oxide layer 22a may serve as a capping layer that prevents hydrogen from being emitted to the outside in the annealing process of implanting hydrogen into the first aluminum oxide layer 22a functioning as a hydrogen implantation layer. In addition, when the first electrode 42 has a predetermined pattern and has a double-sided light-receiving structure in which light is incident on both sides, it may serve as an anti-reflection layer to prevent reflection of light incident on the rear surface of the semiconductor substrate 110. In addition, it may serve as a protective layer covering the first aluminum oxide layer 22a to protect the first aluminum oxide layer 22a from an external acidic substance or the like. Accordingly, reliability is more excellent when used as a stacked structure of the first aluminum oxide layer 22a and the first dielectric layer 22b compared to the case of using the first aluminum oxide layer 22a alone.

The second dielectric layer 32b positioned on the second aluminum oxide layer 32a may serve as an anti-reflection layer that prevents reflection of light incident on the front surface of the semiconductor substrate 110. In addition, it may serve as a protective layer covering the second aluminum oxide layer 32a to protect the second aluminum oxide layer 32a from an external acidic substance or the like. Accordingly, reliability is more excellent when used as a stacked structure of the second aluminum oxide layer 32a and the second dielectric layer 32b compared to the case of using the second aluminum oxide layer 32a alone.

For example, the first dielectric layer 22b may include silicon nitride, silicon oxide, or silicon oxynitride. The second dielectric layer 32b may include silicon nitride, silicon oxide, or silicon oxynitride. For example, when the first dielectric layer 22b and the second dielectric layer 32b are formed of silicon nitride, the roles of the capping layer, the antireflection layer, and the protective layer may be effectively performed. However, the present disclosure is not limited thereto.

In the present embodiment, the first aluminum oxide layer 22a and the second aluminum oxide layer 32a may be simultaneously formed in the same process to have the same material, composition, and thickness. As described above, even when the first aluminum oxide layer 22a and the second aluminum oxide layer 32a play different roles, the first aluminum oxide layer 22a and the second aluminum oxide layer 32a are simultaneously formed, so the manufacturing process may be simplified. In addition, the first dielectric layer 22b and the second dielectric layer 32b may have different materials, compositions, and/or thicknesses. For example, the first dielectric layer 22b and the second dielectric layer 32b may be made of the same material, but may have different compositions and/or thicknesses. This is because the first dielectric layer 32b and the second dielectric layer 32b are formed in separate processes.

However, the present disclosure is not limited thereto. Accordingly, the first aluminum oxide layer 22a and the second aluminum oxide layer 32a may be formed in different separate processes to have different materials, compositions, and/or thicknesses. Alternatively, the first dielectric layer 22b and the second dielectric layer 32b may be simultaneously formed in the same process to have the same material, composition, and thickness. Various other variations are possible.

As mentioned above, even when having the same material, composition and thickness, the first aluminum oxide layer 22a positioned adjacent to the first conductivity-type region 20 composed of the polycrystalline semiconductor layer (especially n-type polycrystalline semiconductor layer) and the second aluminum oxide layer 32a positioned adjacent to the semiconductor substrate 110 (especially the p-type second conductivity-type region 30) may play different roles. More specifically, the first aluminum oxide layer 22a may serve as a hydrogen implantation layer, and the second aluminum oxide layer 32a may serve as a fixed charge passivation layer. This will be described in more detail with reference to FIGS. 5 and 6.

FIG. 5 is a schematic diagram for explaining a recombination model due to a defect (trap site) and fixed charge passivation for preventing it. FIG. 6 is a diagram illustrating a band diagram of a semiconductor substrate, a tunneling layer, and a first conductivity-type region in a solar cell according to an embodiment of the present disclosure.

Referring to FIG. 5, the recombination due to defects is generated by holes positioned in the valence band, electrons positioned in the conduction band, and an unoccupied trap level, thereby degrading passivation characteristics. As shown by the arrow (1) in FIG. 5, the excited electrons are bound to the trap level, and as shown in the arrow (2) of FIG. 5, electrons in the trap level are bonded to the holes and recombination may occur. Then, since the unoccupied trap level re-exists, the process as shown by the arrows (1) and (2) of FIG. 5 is repeated, and the recombination may occur continuously.

Fixed charge passivation is to prevent the occurrence of recombination of electrons and holes by unbinding electrons bound to the trap level by the process shown by the arrow (1) of FIG. 5 by the fixed charge included in the passivation layer. In this case, since the unoccupied trap level continues to exist, the process as shown by the arrows (1) and (2) of FIG. 5 is repeated again, and the recombination may occur.

When the first conductivity type region 20 composed of the n-type polycrystalline semiconductor layer tunnel junctioned to the semiconductor substrate 110 by the tunneling layer 52 is provided as in the present embodiment, as shown in FIG. 6, it is aligned are tunnel junctioned so that the Fermi levels of the semiconductor substrate 110 and the first conductivity-type region 20 have the same value. When joined as shown in FIG. 6, when electrons in the conduction band in the semiconductor substrate 110 pass through the tunneling layer 52, they can easily move to the conduction band of the first conductivity-type region 20. On the other hand, holes in the semiconductor substrate 110 do not pass through the tunneling layer 52. That is, the tunneling layer 52 serves as an energy barrier for holes. Therefore, even if the electrons excited by the process as shown in the arrow (1) of FIG. 5 are bound to the trap level, the electrons bound to the trap level are released by energy such as external heat, light, or the like, or occupy the trap level in that state, thereby preventing other electrons from being trapped. Accordingly, even if the electrons are bound to the trap level, the electrons bound to the trap level are not recombinated, so it is not necessary to release them using the fixed charge passivation. Accordingly, since fixed charge passivation is not required in the first conductivity-type region 20 composed of the n-type polycrystalline semiconductor layer tunnel junctioned to the semiconductor substrate 110, it is not necessary to consider the polarity of the fixed charges of the passivation layer.

Accordingly, even if the first aluminum oxide layer 22a having a negative fixed charge is used in the first conductivity type region 20 composed of the n-type polycrystalline semiconductor layer, a problem due to fixed charge passivation does not occur. Conventionally, since aluminum oxide has a negative fixed charge, it has been mainly used to implement fixed charge passivation on a semiconductor substrate having p-type conductivity, and it was not used as a passivation layer for the polycrystalline semiconductor layer (especially, the n-type polycrystalline semiconductor layer) as in the present embodiment. This is predicted to be due to considering only the polarity of the fixed charge without considering the crystal structure (for example, polycrystalline structure) and the junction structure (for example, tunnel junction) of the conductive-type region.

As described above, in the present embodiment, the first aluminum oxide layer 22a does not function as the fixed charge passivation layer. Instead, in the present embodiment, the first aluminum oxide layer 22a may serve to implant hydrogen into the semiconductor substrate 110 and/or the first conductivity-type region 20. Hydrogen implanted into the semiconductor substrate 110 and/or the first conductivity-type region 20 may combine with defects in the semiconductor substrate 110 and/or the first conductivity-type region 20 to decrease the defect density. Thereby, the recombination of electrons and holes is effectively prevented, so that it is possible to improve the passivation characteristics and increase the efficiency of the solar cell 100.

The first aluminum oxide layer 22a made of aluminum oxide may have a relatively high hydrogen content per unit volume and may effectively implant hydrogen even with a thin thickness. For example, the hydrogen content per unit volume of the first aluminum oxide layer 22a may be greater than the hydrogen content per unit volume of the first dielectric layer 22b (e.g. the first dielectric layer 22b made of silicon nitride). Alternatively, the hydrogen implantation effect of the first aluminum oxide layer 22a may be superior to that of the first dielectric layer 22b (e.g. the first dielectric layer 22b made of silicon nitride). As shown in FIG. 7, it can be seen that an implied open-circuit voltage Voc is higher when aluminum oxide (AlOx) is used as the passivation layer than when silicon nitride (SiNy) is used as the passivation layer. From this, it can be seen that the hydrogen implantation effect of the first aluminum oxide layer 22a made of aluminum oxide is superior to the hydrogen implantation effect of the first dielectric layer 22b made of silicon nitride. In particular, when the rear surface of the semiconductor substrate 110 has an uneven portion (e.g. the second unevenness 114), it can be seen that the implied open-circuit voltage is significantly higher when aluminum oxide (AlOx) is used as the passivation layer than when silicon nitride (SiNy) is used as a passivation layer. From this, it can be seen that aluminum oxide (AlOx) has a high effect of lowering the defect density of the semiconductor substrate 110 when many defects exist in the semiconductor substrate 110.

As described above, the hydrogen implantation effect may be improved by using the first aluminum oxide layer 22a having a high hydrogen content and excellent hydrogen implantation effect. The first aluminum oxide layer 22a may have an excellent hydrogen implantation effect even with a small thickness, and the hydrogen implantation effect may be saturated at a certain level or more. Accordingly, the thickness of the first aluminum oxide layer 22a may be smaller than the thickness of the first dielectric layer 22b. Then, while maintaining the hydrogen implantation effect, the thickness of the first passivation layer 22 that must be removed when the first electrode 42 is formed is reduced to simplify the formation process of the first electrode 42 and improve the contact characteristics of the first electrode 42.

On the other hand, the second aluminum oxide layer 32a has p-type conductivity and is positioned adjacent to the second conductivity-type region 30 constituting a part of the semiconductor substrate 110, and serves to implement fixed charge passivation by negative fixed charges. Considering that recombination may occur continuously in the semiconductor substrate 110 by repeating the process as shown in the arrows (1) and (2) of FIG. 5, this is to prevent the recombination of electrons and holes by releasing the bondage of electrons bound to the trap level again.

As described above, in the present embodiment, different passivation is implemented in consideration of the crystal structure, junction structure, conductivity type, etc. of the first and second conductivity-type regions 20 and 30, but the first and second aluminum oxide layers 22a and 32a having the same material are provided. In addition, the first and second dielectric layers 22b and 32b may be provided with the same material thereon. The manufacturing process may be simplified by providing the first and second passivation layers 22 and 32 having the same stacked structure as described above.

The first and second electrodes 42 and 44 may have metal electrode layers made of various conductive materials (e.g. metal) and may have various shapes.

Referring to FIG. 2, the first electrode 42 may include a plurality of finger electrodes 42a spaced apart from each other and formed in one direction while having a constant pitch. Although the figure illustrates that the finger electrodes 42a are parallel to each other and parallel to the edge of the semiconductor substrate 110, the present disclosure is not limited thereto. In addition, the first electrode 42 may include a bus bar electrode 42b formed in a direction crossing (e.g. orthogonal) to the finger electrodes 42a to connect the finger electrodes 42a. Only one bus bar electrode 42b may be provided, or a plurality of bus bar electrodes 42b may be provided with a pitch greater than that of the finger electrodes 42a as shown in FIG. 2. In this case, the width of the bus bar electrode 42b may be greater than the width of the finger electrode 42a, but the present disclosure is not limited thereto. Accordingly, the width of the bus bar electrode 42b may be equal to or smaller than the width of the finger electrode 42a.

The second electrode 44 may include a finger electrode 44a and a bus bar electrode 44b corresponding to the finger electrode 42a and the bus bar electrode 42b of the first electrode 42, respectively. For the finger electrode 44a and the bus bar electrode 44b of the second electrode 44, the contents of the finger electrode 42a and the bus bar electrode 42b of the first electrode 42 may be applied as they are. The width and pitch of the finger electrodes 42a of the first electrode 42 may be the same as or different from the width and pitch of the finger electrodes 44a of the second electrode 44. The width of the bus bar electrode 42b of the first electrode 42 may be the same as or different from the width of the bus bar electrode 44b of the second electrode 44, but the bus bar electrode 42b of the first electrode 42 and the bus bar electrode 44b of the second electrode 44 may be disposed to have the same pitch at the same position.

As described above, when the first and second electrodes 42 and 44 have a constant pattern, the solar cell 100 has a double-sided light-receiving structure in which light can be incident to the front and rear surfaces of the semiconductor substrate 110. Accordingly, it is possible to contribute to the improvement of the efficiency of the solar cell 100 by increasing the amount of light used in the solar cell 100. However, the present disclosure is not limited thereto. Accordingly, it is possible that the first electrode 42 and the second electrode 44 have different planar shapes. Various other variations are possible.

In the present embodiment, the material or composition of the first electrode 42 may be different from that of the second electrode 44 to prevent the tunneling layer 52 from being damaged when the material included in the first electrode 42 reaches the tunneling layer 52 during a fire-through process. For example, the glass frit content of the first electrode 42 may be smaller than the glass frit content of the second electrode 44. However, the present disclosure is not limited thereto, and the glass frit content of the first electrode 42 may be equal to or greater than the glass frit content of the second electrode 44. Also, the material or composition of the first electrode 42 may be the same as that of the second electrode 44.

Alternatively, the material or composition of the finger electrodes 42a and 44a and the bus bar electrodes 42b and 44b may be different from each other. For example, considering that fire-through characteristics may be different from each other when the widths of the finger electrodes 42a and 44a and the bus bar electrodes 42b and 44b are different, the glass frit content of the finger electrodes 42a and 44a and the bus bar electrodes 42b and 44b may be different from each other. For example, the glass frit content of the finger electrodes 42a and 44a from which carriers are to be directly collected may be smaller than the glass frit content of the bus bar electrodes 42b and 44b. In this case, the finger electrodes 42a and 44a are formed in direct contact with the conductive regions 20 and 30, and the bus bar electrodes 42b and 44b may not be in direct contact with the conductive regions 20 and 30 and may be spaced apart from the conductive-type regions 20 and 30 with the first or second passivation layers 22 and 32 interposed therebetween. However, the present disclosure is not limited thereto. Accordingly, the material or composition of the finger electrodes 42a and 44a may be the same as the material or composition of the bus bar electrodes 42b and 44b.

In FIG. 2, three bus bar electrodes 42b and 44b are provided based on one surface of the solar cell 10, but the present disclosure is not limited thereto. The number of the bus bar electrodes 42b and 44b may be two or more, and the number, shape, arrangement, etc. may vary depending on the shape of the interconnector, ribbon, wiring material, etc. attached to the bus bar electrodes 42b and 44b.

As a modified example, as shown in FIG. 8, the number of bus bar electrodes 42b may be 6 to 33 (for example, 8 to 33, for example 10 to 33, especially 10 to 15), respectively, based on one surface, and may be positioned at a uniform distance from each other. Here, the bus bar electrode 42b may include a pad portion 422 having a relatively wide width and provided in plurality in the longitudinal direction, and may further include a line portion 421 connecting the plurality of pad portions 422 in the longitudinal direction. In addition, the first electrode 42 may further include an edge line 42c, an edge electrode portion 42d, and the like. Although the first electrode 42 is mainly illustrated in FIG. 8 and the above description, the second electrode 44 may have the same or similar shape. The edge line 42c and the edge electrode portion 42d may or may not be provided, and the shape and arrangement thereof may be variously modified.

The solar cell 100 having the bus bar electrode 42b having such a shape may be connected to a neighboring solar cell 100 or an external circuit using a wire-shaped wiring material (interconnector). The wire-shaped wiring material may have a smaller width than a ribbon having a relatively wide width (e.g. greater than 1 mm). For example, the maximum width of the wiring member may be 1 mm or less (e.g. 500 μm or less, more specifically, 250 to 500 μm).

Such a wiring material may have a structure including a core layer and a solder layer formed on a surface thereof. Then, a large number of wiring materials may be effectively attached by a process of applying heat and pressure while the plurality of wiring materials are mounted on the solar cell 100. The wiring material or the core layer included therein may include a rounded portion. That is, the cross-section of the wiring member or the core layer may include a portion in which at least a portion is a circular shape, a part of a circular shape, an elliptical shape, a part of an elliptical shape, or a curved line.

Then, the moving distance of the carrier may be reduced by a large number of wiring members while minimizing light loss and material cost by the wiring member having a small width. As described above, the efficiency of the solar cell 100 may be improved, and the material cost due to the wiring material may be reduced by reducing the moving distance of the carrier while reducing the light loss.

In addition, the structure, shape, and arrangement of the first and second electrodes 42 and 44, and the structure and shape of wiring materials, interconnectors, ribbons, etc. connected thereto may be variously modified.

In the present embodiment, by providing the second conductivity-type region 30 composed of a doped region and the first conductivity-type region 20 composed of a semiconductor layer, it is possible to minimize incident interference of light from the front surface of the semiconductor substrate 110 and to minimize the degradation of recombination characteristics due to the first conductivity-type region 20. Accordingly, the characteristics of the solar cell 100 may be improved.

In this structure, since the first passivation layer 22 positioned on the first conductivity-type region 20 (in particular, the n-type semiconductor layer) includes a first aluminum oxide layer 22a and a first dielectric layer 22b, it is possible to improve the hydrogen implantation effect and improve reliability by the first dielectric layer 22b while implementing the hydrogen passivation effect by the first aluminum oxide layer 22a. In addition, since the second passivation layer 32 positioned on the second conductivity-type region 30 (particularly, a part of the semiconductor substrate 110 having a p-type) includes a second aluminum oxide layer 32a and the second dielectric layer 32b, it is possible to implement field effect passivation by the second aluminum oxide layer 32a and improve reliability by the second dielectric layer 32b.

As described above, the first and second passivation layers 22 and 32 are configured with materials and stacked structures in consideration of all of the crystal structure, junction structure, conductivity type, etc. of the first and second conductivity-type regions 20 and 30, thus the passivation characteristics and efficiency of the solar cell 100 may be improved. In particular, the first aluminum oxide layer 22a and the second aluminum oxide layer 32a may implement different passivation in consideration of all of the crystal structure, junction structure, conductivity type, etc. of the first and second conductivity-type regions 20 and 30, but may have the same material. In addition, the first and second dielectric layers 22b and 32b may be formed of the same material thereon. The manufacturing process may be simplified by providing the first and second passivation layers 22 and 32 having the same stacked structure as described above.

An embodiment of a method of manufacturing the above-described solar cell 100 will be described in detail with reference to FIG. 9 and FIGS. 10A to 10J. A detailed description of the content already described in the above description will be omitted, and parts not described will be described in detail.

FIG. 9 is a flowchart of a method of manufacturing a solar cell according to an embodiment of the present disclosure, and FIGS. 10A to 10J are cross-sectional views illustrating a method of manufacturing a solar cell according to an embodiment of the present disclosure.

Referring to FIG. 9, the method of manufacturing the solar cell 100 according to the present embodiment includes a tunneling layer forming step S12, a semiconductor layer forming step S14, a first etching step S16, a second etching step S18, a doping step S20, an aluminum oxide layer forming step S22, a dielectric layer forming step (a first annealing step) S24, a second annealing step S26, and an electrode forming step S28.

As shown in FIG. 10A, the semiconductor substrate 110 having the first uneven portions 112a and 114a is prepared. For example, the first uneven portion 112a of the first unevenness 112 may be provided on the front surface of the semiconductor substrate 110, and the first uneven portion 114a of the second unevenness 114 may be provided on the rear surface of the semiconductor substrate 110.

For example, in the present embodiment, the first uneven portions 112a and 114a may be formed by wet etching. An alkaline solution (e.g. a solution including potassium hydroxide (KOH)) may be used as an etching solution used for the wet etching. According to such wet etching, the first uneven portions 112a and 114a may be formed on the surface of the semiconductor substrate 110 by a simple process within a short time. In this case, a dipping process, in which both surfaces (front and rear) of the semiconductor substrate 110 can be etched together by dipping the semiconductor substrate 110 in an etching solution, may be used. Then, since the first uneven portions 112a and 114a formed on the front and rear surfaces of the semiconductor substrate 110 may be formed together by a single dipping process, the process may be simplified.

According to such wet etching, since the first uneven portions 112a and 114a are etched according to the crystal plane of the semiconductor substrate 110, the outer surfaces of the first uneven portions 112a and 114a are formed to have a constant crystal plane (e.g. (111) plane). Accordingly, the first uneven portions 112a and 114a may have a pyramid shape having four (111) planes, may have an average size of a micrometer level, and may have a relatively large first deviation in size deviation. However, the present disclosure is not limited thereto, and the first uneven portions 112a and 114a may be formed by various methods and may have various shapes, average sizes, size deviations, and the like.

In the present embodiment, since the first uneven portions 112a and 114a are respectively formed on both surfaces of the semiconductor substrate 110, light loss may be minimized in the solar cell 110 having a double-sided light-receiving structure. However, the present disclosure is not limited thereto, and it is also possible that the first uneven portions 112a and 114a are formed on one of the front surface, the rear surface, and the side surface of the semiconductor substrate 110. Alternatively, it is also possible that the first uneven portions 112a and 114a are not formed on the front surface, the rear surface, and the side surface of the semiconductor substrate 110.

Subsequently, as shown in FIG. 10B, a tunneling layer 52 is formed entirely on the surface of the semiconductor substrate 110 in the tunneling layer forming step S12. More specifically, the tunneling layer 52 may be formed on the front and rear surfaces, and optionally on the side surface of the semiconductor substrate 110. Although the drawing illustrates that the tunneling layer 52 positioned on the front surface of the semiconductor substrate 110 and the tunneling layer 52 positioned on the rear surface of the semiconductor substrate are formed separately from each other, the tunneling layer 52 may be formed entirely on the surface of the semiconductor substrate 110 by forming not only the front and rear surfaces of the semiconductor substrate 110 but also the side surface. In this case, the tunneling layers 52 formed on the front surface, the side surface, and the rear surface of the semiconductor substrate 110 may have a shape continuously connected to each other.

The tunneling layer 52 may be formed by, for example, a thermal growth method, a vapor deposition method (e.g. plasma-enhanced chemical vapor deposition (PECVD), atomic layer deposition (ALD)), or the like. However, the present disclosure is not limited thereto, and the tunneling layer 52 may be formed by various methods.

Subsequently, as shown in FIG. 10C, a semiconductor layer 202 may be formed on the tunneling layer 52 in the semiconductor layer forming step S14. More specifically, the semiconductor layer 202 is formed on the tunneling layer 52 formed on the front and rear surfaces and optionally on the side surface of the semiconductor substrate 110. Although the drawing illustrates that the semiconductor layer 202 positioned on the front surface of the semiconductor substrate 110 and the semiconductor layer 202 positioned on the rear surface of the semiconductor substrate 110 are formed separately from each other, the semiconductor layer 202 may be formed entirely on the surface of the semiconductor substrate 110 by forming not only the front and rear surfaces but also the side surface of the semiconductor substrate 110 on the tunneling layer 52. In this case, the semiconductor layers 202 formed on the front surface, the side surface, and the rear surface of the semiconductor substrate 110 may have a shape continuously connected to each other.

The semiconductor layer 202 may be formed by, for example, a deposition method (e.g. plasma-enhanced chemical vapor deposition (PECVD)). The semiconductor layer 202 may not include the first conductivity-type dopant, and may include the first conductivity-type dopant in at least a portion of the layer or a portion thereof. In addition, the semiconductor layer 202 may be formed of a semiconductor layer (for example, an amorphous semiconductor layer, a microcrystalline semiconductor layer, the polycrystalline semiconductor layer, for example, an amorphous silicon layer, a microcrystalline silicon layer, or a polycrystalline silicon layer) having a crystal structure different from that of the semiconductor substrate 110. In particular, the semiconductor layer 202 may be formed of the polycrystalline semiconductor layer (e.g. a polycrystalline silicon layer) to have excellent electrical characteristics. In this case, the semiconductor layer 202 may be deposited in the form of the polycrystalline semiconductor layer, or after being deposited in the form of an amorphous semiconductor or microcrystalline semiconductor layer, a recrystallization process may be performed to form the polycrystalline semiconductor layer.

When the semiconductor layer 202 is formed of the polycrystalline semiconductor layer including the first conductivity-type dopant, the semiconductor layer 202 may be viewed as the first conductivity-type region (reference numeral 20 in FIG. 10F, hereinafter the same). Therefore, in this case, it can be considered that the first conductivity-type region 20 is formed by the process of forming the semiconductor layer 202.

Then, as shown in FIG. 10D, it is performed the first etching step S16 of removing the tunneling layer 52 and the semiconductor layer 202 positioned on the front surface of the semiconductor substrate 110 by a cross-sectional etching. When the tunneling layer 52 and the semiconductor layer 202 are also positioned on the side of the semiconductor substrate 110, a portion of the tunneling layer 52 and the semiconductor layer 202 positioned on the side surface of the semiconductor substrate 110 may be etched together in the first etching step S16. In addition, in the drawing, it is exemplified that the tunneling layer 52 is etched together with the semiconductor layer 202 in the first etching step S16. However, the present disclosure is not limited thereto, and all or part of the tunneling layer 52 may remain without being etched in the first etching step S16.

The first etching step S16 will be described in more detail when the second etching step S18 performed in the process shown in FIG. 10E is described.

Next, as shown in FIG. 10E, the second etching step S18 of forming the second uneven portion 112b on the front surface of the semiconductor substrate 110 is performed.

In the present embodiment, the first etching step S16 and the second etching step S18 may be performed by an in-situ process consisting of a continuous process in the same equipment. Accordingly, the first and second etching steps S16 and S18 may be performed using an etching method capable of forming the second uneven portion 112b in the second etching step S18 while being capable of performing a cross-sectional etching in the first etching step S16 according to the process conditions.

For example, in the present embodiment, the first etching step S16 and the second etching step S18 are performed by reactive ion etching (RIE), but the process conditions may be different from each other. The reactive ion etching is a dry etching method of etching by generating plasma after supplying an etching gas (e.g. $Cl_2$, $SF_6$, $NF_3$, HBr, etc.). The reactive ion etching may be applied to cross-sectional etching. In addition, the material may be etched basically isotropically without considering the crystal direction, etc. of the crystal grains. Accordingly, depending on the process conditions such as the etching gas to be used, the semiconductor layer 202 and/or the tunneling layer 52 positioned on the front surface of the semiconductor substrate 110 may be entirely removed, and the second uneven portion 112b may be formed by etching one surface of the semiconductor substrate 110.

In the present embodiment, desired etching is achieved by adjusting process conditions such as the type, partial pressure, and pressure of the etching gas in the first etching step S16 and the second etching step S18. Since various known process conditions may be applied thereto, a detailed description thereof will be omitted.

The second uneven portion 112b of the first unevenness 112 formed by the second etching step S18 is formed on the outer surface of the first uneven portion 112a, and has an average size smaller than that of the uneven portion 112a of the first unevenness 112. The reactive ion etching may form the fine and uniform second uneven portion 112b on the surface of the semiconductor substrate 110 regardless of the crystal direction of the crystal grains. In this case, the second uneven portion 112b may be formed to have a sharp upper end, may have an average size of a nanometer level, and may have a second deviation in which the size deviation is smaller than the first deviation.

As described above, in the present embodiment, on the first uneven portion 112a of the first unevenness 112, the second uneven portion 112b having an average size smaller than this is formed, thus it is possible to minimize the reflectivity that may occur on the surface of the semiconductor substrate 110.

In the present embodiment, only the first unevenness 112 includes the first uneven portion 112a and the second uneven portion 112b, and the second unevenness 114 includes the first uneven portion 114a and does not include the second uneven portion 112b. Since the second etching step S18 of forming the second uneven portion 112b is performed after the first etching step S16 of etching the semiconductor layer 202, the rear surface of the semiconductor substrate 110 is covered by the semiconductor layer 202, and the second etching step S18 is performed by the cross-sectional etching. Accordingly, the second uneven portion 112b is formed on the front surface of the semiconductor substrate 110 and the second uneven portion 112b is not formed on the rear surface of the semiconductor substrate 110. Accordingly, the passivation characteristics may be improved by minimizing the surface area of the rear surface of the semiconductor substrate 110, which is relatively small in incidence of light, and minimizing damage caused by the reactive ion etching.

However, the present disclosure is not limited thereto, and the first etching step S16 and the second etching step S18 may be performed by separate devices or processes, and the second etching step S18 may not be performed. Various other variations are possible.

Subsequently, as shown in FIG. 10F, in the doping step S20, the second conductivity-type region 30 is formed by doping or diffusing the second conductivity-type dopant. In the doping step S10, the first conductivity-type dopant of the semiconductor layer 202 or the first conductivity-type region 20 may be doped, diffused, or activated together. The method of forming the first conductivity-type region 20 and the second conductivity-type region 30 may use various known methods.

The first conductivity-type region 20 may be formed based on the semiconductor layer 202.

For example, when the semiconductor layer 202 does not include the first conductivity-type dopant, the first conductivity type region 20 is formed by doping or diffusing the first conductivity-type dopant. Various methods may be used as a method of doping or diffusing the first conductivity-type dopant into the semiconductor layer 202. For example, the first conductivity-type region 20 may be formed by doping or diffusing the first conductivity-type dopant by a method such as an ion implantation method, a thermal diffusion method, or a laser doping method. In this case, a heat treatment process for activation of the first conductivity-type dopant may be additionally performed. The heat treatment process for activation is not essential and may be omitted depending on a doping method or the like. Alternatively, after the first conductivity-type region 20 is formed by diffusing the first conductivity-type dopant by performing the heat treatment process while forming a first dopant film (e.g. phosphorus silicate glass (PSG) film) including the first conductivity-type dopant on the semiconductor layer 202, the first dopant film may be removed. The first dopant film may be formed by various methods, such as atmospheric pressure chemical vapor deposition (APCVD), plasma enhanced chemical vapor deposition (PECVD), or the like. In particular, an ion implantation method or a method of forming the first dopant film may be advantageous for a cross-sectional doping.

If the first conductivity-type dopant is doped after forming an intrinsic semiconductor layer 202 as described above, the intrinsic semiconductor layer 202 may be more easily etched in the first etching step S16, etc.

As another example, when at least a portion of the layer or at least a portion of the semiconductor layer 202 includes the first conductivity type dopant, the first conductivity-type region 20 may be formed or activated by doping, diffusing, or activating the first conductivity-type dopant included in the semiconductor layer 202 through the heat treatment process. For example, the semiconductor layer 202 may include a doped layer including the first conductivity-type dopant and an undoped layer not including the first conductivity-type dopant, and may form the first conductivity-type region 20 by doping and diffusing the first conductivity-type dopant of the doped layer into the undoped layer in the heat treatment process. As another example, when the semiconductor layer 202 is formed, the semiconductor layer 202 may be formed to have the first conductivity-type using a gas (e.g. PH$_3$ gas) including the first conductivity-type dopant. Then, since the semiconductor layer 202 forms the first conductivity-type region 20 as it is without a separate doping process, a manufacturing process may be simplified by omitting a process for doping the semiconductor layer 202. Even in this case, a heat treatment process for activating the first conductivity-type dopant may be additionally performed. The heat treatment process for activation may be not essential and may be omitted depending on a doping method or the like. In addition, various modifications are possible.

The second conductivity-type region 30 may be formed by doping or diffusing the second conductivity-type dopant into inside of the semiconductor substrate 110 from the front surface of the semiconductor substrate 110. Various methods may be used as a method of doping or diffusing the second conductivity-type dopant on the front surface side of the semiconductor substrate 110. For example, the second conductivity-type region 30 may be formed by doping or diffusing the second conductivity-type dopant by a partial thickness on the front surface of the semiconductor substrate 110 by a method such as an ion implantation method, a thermal diffusion method, or a laser doping method. In this case, a heat treatment process for activating the second conductivity-type dopant may be additionally performed. The heat treatment process for activation may be not essential and may be omitted depending on a doping method or the like. Alternatively, after the second conductivity type region 30 is formed by diffusing the second conductivity-type dopant by performing the heat treatment process while forming a second dopant film (e.g. boron silicate glass (BSG) film) including the second conductivity-type dopant on the semiconductor substrate 110, the second dopant film may be removed. The second dopant film may be formed by various methods, such as atmospheric pressure chemical vapor deposition (APCVD), plasma enhanced chemical vapor deposition (PECVD), or the like. In particular, an ion implantation method or a method of forming the second dopant film may be advantageous for a cross-sectional doping.

The heat treatment process for doping, diffusion, or activation to form the first conductivity-type region 20 and the heat treatment process for doping, diffusion, or activation to form the second conductivity-type region 30 may be performed simultaneously or separately from each other. Alternatively, after forming the first and second conductivity-type regions 20 and 30, the first conductivity-type dopant of the first conductivity-type region 20 and the second conductivity-type dopant of the second conductivity-type region 30 may be activated together by co-activation heat treatment. For example, the co-activation heat treatment may be performed at various temperatures capable of activating the first conductivity-type dopant and the second conductivity-type dopant together. However, the present disclosure is not limited thereto. Therefore, an activation heat treatment is performed after forming the second conductivity-type region 30, and then an activation heat treatment is performed after forming the first conductivity-type region 20, and it is also possible to separately perform the activation heat treatment of the first and second conductivity-type regions 20 and 30. Various other variations are possible.

In addition, the second conductivity-type dopant may be doped first and the first conductivity-type dopant may be doped later, or the first conductivity-type dopant may be doped first and the second conductivity-type dopant may be doped later. When the first and second conductivity-type regions 20 and 30 are formed by the first and second dopant films, respectively, the first and second conductivity-type regions 20 and 30 may be formed together by heat treatment in a state in which the first dopant film for forming the first conductivity-type region 20 and the second dopant film for forming the second conductivity-type region 30 are formed together, and then the first and second dopant films may be removed. Various other variations are possible.

After the process of forming the conductive-type regions 20 and 30 including the first and second conductivity-type regions 20 and 30, a cleaning process may be performed to remove by-products, etc. remaining during the doping, diffusion, or activation heat treatment process.

Subsequently, as shown in FIGS. 10G to 10I, a passivation layer forming step including forming the first passivation layer 22 on the rear surface of the semiconductor substrate 110 and forming the second passivation layer 32 on the front surface of the semiconductor substrate 110 is performed. In this case, the forming of the first passivation layer 22 may include a process of forming the first aluminum oxide layer 22a having hydrogen on the first conductivity-type region 20, and a process of forming the first dielectric layer 22b positioned on the first aluminum oxide layer 22a and including a material different from the first aluminum oxide layer 22a. In addition, the forming of the second passivation layer 32 may include a process of forming the second aluminum oxide layer 32a on the second conductivity-type region 30, and a process of forming the second dielectric layer 32b positioned on the second aluminum oxide layer 32a and including a material different from the aluminum oxide layer 32a. In addition, hydrogen included in the first aluminum oxide layer 22a may be implanted into the first conductivity-type region 20 and/or the semiconductor substrate 110 by an annealing process performed in the passivation layer forming step and/or the electrode formation step, which will be described in more detail.

More specifically, as shown in FIG. 10G, the process of forming the first aluminum oxide layer 22a and the process of forming the second aluminum oxide layer 32a may be performed to form the first and second aluminum oxide layers 22a and 32a in the aluminum oxide layer forming step S22. In this case, the process of forming the first aluminum oxide layer 22a and the process of forming the second aluminum oxide layer 32a may be performed together by the same process, so that the first aluminum oxide layer 22a and the second aluminum oxide layer 32a may be formed together in the same process. Then, the first aluminum oxide layer 22a and the second aluminum oxide layer 32a may be composed of the same layer having the same material, composition, and thickness. As described above, when the first aluminum oxide layer 22a and the second aluminum oxide layer 32a are formed together in the same process, the process may be simplified.

Although the drawing illustrates that the first aluminum oxide layer 22a and the second aluminum oxide layer 32a are formed separately from each other, the first aluminum oxide layer 22a and/or the second aluminum oxide layer 32a may be formed entirely on the surface of the semiconductor substrate 110 by forming not only the front and rear surfaces but also the side surface of the semiconductor substrate 110. In this case, the first aluminum oxide layer 22a formed on the rear surface of the semiconductor substrate 110 and the second aluminum oxide layer 32a formed on the front surface of the semiconductor substrate 110 may be connected to each other from the side surface, so that the aluminum oxide layer formed on the front surface, the side surface, and the rear surface may have a shape continuously connected to each other.

The present disclosure is not limited thereto. Accordingly, the process of forming the first aluminum oxide layer 22a and the process of forming the second aluminum oxide layer 32a may be separately performed to form the first and second aluminum oxide layers 22a and 32a in separate processes. In this case, the first aluminum oxide layer 22a and the second aluminum oxide layer 32a may be the same layer having the same material, composition, and thickness, or may be different layers having different materials, compositions, or thicknesses.

The first aluminum oxide layer 22a and/or the second aluminum oxide layer 32a may be formed by various methods, for example, it may be formed by an atomic layer deposition method (ALD), a plasma-induced chemical vapor deposition method, or the like. For example, the first aluminum oxide layer 22a and/or the second aluminum oxide layer 32a may be formed by an atomic layer deposition method using $H_2O$, trimethylamine (TMA), or the like as a raw material.

Subsequently, as shown in FIG. 10H, a second dielectric layer 32b is formed in the second dielectric layer forming step S24. Here, the second dielectric layer 32b may be made of silicon nitride, silicon oxide, or silicon oxynitride, and may be, for example, a silicon nitride layer made of silicon nitride.

In the present embodiment, the second dielectric layer forming step S24 may include a first annealing process and a deposition process performed after the first annealing process. That is, the first annealing process may be performed before the deposition process in the second dielectric layer forming step S24. The first annealing process and the deposition process may be performed by an in-situ process that is continuously performed in the same equipment.

The first annealing process may be a process in which hydrogen included in the first aluminum oxide layer 22a is implanted into the first conductivity type region 20 and/or the semiconductor substrate 110, and may be performed at a temperature, in a gas atmosphere, etc. suitable for hydrogen implantation. For example, the first annealing process may be performed at a temperature of 300 to 600° C., in a nitrogen ($N_2$) atmosphere.

The deposition process may be performed at a temperature, a gas atmosphere, or the like at which the second dielectric layer 32b may be formed. For example, the deposition process may be performed by atmospheric pressure chemical vapor deposition or plasma-induced chemical vapor deposition performed in a gas atmosphere of silane ($SiH_4$) or ammonia ($NH_3$).

Subsequently, as shown in FIG. 10I, a first dielectric layer 22b is formed in the first dielectric layer forming step S26. Here, the first dielectric layer 22b may be made of silicon nitride, silicon oxide, or silicon oxynitride, and may be, for example, a silicon nitride layer made of silicon nitride.

In the present embodiment, the first dielectric layer forming step S26 may include a deposition process. The deposition process may be performed at a temperature, a gas atmosphere, or the like at which the first dielectric layer 22b can be formed. For example, the deposition process may be performed by atmospheric pressure chemical vapor deposition or plasma-induced chemical vapor deposition performed in a gas atmosphere of silane ($SiH_4$) or ammonia ($NH_3$).

Next, as shown in FIG. 10J, the first and second electrodes 42 and 44 respectively connected to the first conductivity-type region 20 and the second conductivity-type region 30 are formed in the electrode formation step S28.

In the present embodiment, after the paste for forming the first electrode and the paste for forming the second electrode are applied on the first passivation layer 22 and the second passivation layer 32 by screen printing or the like, the first and second electrodes 42 and 44 may be formed while forming the openings 102 and 104 by fire-through or laser firing contact, etc. In this case, since the openings 102 and 104 are formed when the first and second electrodes 42 and 44 are fired, there is no need to add a separate process for forming the openings 102 and 104.

In this case, a second annealing process of implanting hydrogen included in the first aluminum oxide layer 22a into the first conductivity-type region 20 and/or the semiconductor substrate 110 may be performed by a process of firing the first and second electrodes 42 and 44. That is, when a firing process performed at a relatively high temperature (e.g. a higher temperature than the first annealing process) is performed in the step of forming the first and second electrodes 42 and 44, hydrogen included in the first aluminum oxide layer 22a may be effectively implanted into the first conductivity-type region 20 and/or the semiconductor substrate 110 due to the high temperature of the firing process. In this case, the first dielectric layer 22b serves as a capping layer that prevents out-diffusion of hydrogen included in the first aluminum oxide layer 22a. Hydrogen may be effectively implanted into the first conductivity-type region 20 and/or the semiconductor substrate 110 due to the high temperature of the firing process and the first aluminum oxide layer 22a serving as a capping layer.

As another example, the openings 102 and 104 may be respectively formed in the first passivation layer 22 and the second passivation layer 32, and the first and second electrodes 42 and 44 may be formed in the openings 102 and 104 using various methods such as plating method and vapor deposition method.

As described above, in the present embodiment, the semiconductor layer 202 and/or the tunneling layer 52 positioned on the front surface of the semiconductor substrate 110 are removed by the first etching step S16. Accordingly, the second conductivity-type region 30 is configured as a doped region formed by doping (or diffusing) the second conductivity-type dopant into the semiconductor substrate 110. The first conductivity-type region 20 is formed based on the semiconductor layer 202 formed on the tunneling layer 52 and is formed of a semiconductor layer having a crystal structure different from that of the semiconductor substrate 110. Accordingly, it is possible to minimize the incident interference of the light from the front surface of the semiconductor substrate 110, and to minimize the degradation of recombination characteristics due to the first conductivity-type region 20 positioned on the rear surface of the semiconductor substrate 110. Accordingly, the characteristics of the solar cell 100 may be greatly improved.

In addition, hydrogen passivation may occur by implanting hydrogen included in the first aluminum oxide layer 22a into the first conductivity-type region 20 and/or the semiconductor substrate 110 through the first annealing process and/or the second annealing process, thereby improving passivation characteristics in the solar cell 100 having the first conductivity-type region 20 formed of a semiconductor layer (especially, n-type semiconductor layer). Accordingly, the efficiency of the solar cell 100 can be improved through a simple process.

In the above drawings and descriptions, it has been exemplified that the first aluminum oxide layer 22a and a first dielectric layer 22b are sequentially formed in contact with each other on the first conductivity-type region 20, and the second aluminum oxide layer 32a and the second dielectric layer 32b are sequentially formed in contact with each other on the second conductivity-type region 30. However, in the heat treatment process such as the doping step S20 and the first and/or second annealing process, as shown in FIG. 11, the silicon oxide layers 20a and 30a may be formed and positioned between the first conductivity-type region 20 and the first aluminum oxide layer 22a and/or between the second conductivity-type region 30 and the second aluminum oxide layer 32b. The silicon oxide layers 20a and 30a may be provided together with the first and/or second passivation layers 20 and 30 to further improve the passivation characteristics. However, the present disclosure is not limited thereto.

Hereinafter, the present disclosure will be described in more detail according to the experimental examples of the present disclosure. However, the experimental examples of the present disclosure are only for illustrating the present disclosure, and the present disclosure is not limited thereto.

Embodiment 1

A plurality of solar cells having a structure as shown in FIG. 1 are manufactured. More specifically, by preparing a single crystal silicon substrate having phosphorus as a base dopant, a first conductivity type region composed of a tunneling layer composed of a silicon oxide layer and a polycrystalline silicon layer including phosphorus (P) as a first conductivity-type dopant is formed, and a second conductivity-type region composed of a doped region including boron as a second conductivity-type dopant is formed. First and second aluminum oxide layers are simultaneously formed on the first and second conductivity-type regions by using an atomic layer deposition method. A second dielectric layer composed of a silicon nitride layer is formed on the second aluminum oxide layer. A deposition process of forming a silicon nitride layer after performing the first annealing process may be performed at a temperature of 550° C. and a nitrogen atmosphere in the process of forming the second dielectric layer. Then, a deposition process is performed on the first aluminum oxide layer to form a first dielectric layer composed of a silicon nitride layer. Then, after the paste for forming the first electrode and the paste for forming the second electrode are applied on the first passivation layer and the second passivation layer by screen printing, they are fired, while performing the second annealing process, the first and second electrodes connected to the first and second conductivity-type regions are formed by fire-through.

Comparative Example 1

A plurality of solar cells are manufactured in the same manner as in Embodiment 1, except that the process of forming the first and second aluminum oxide layers and the first annealing process are not performed, so that the first and second passivation layers each are made of only a silicon nitride layer.

Comparative Example 2

A plurality of solar cells are manufactured in the same manner as in Embodiment 1, except that the process of forming the first and second dielectric layers is not performed, so that the first and second passivation layers each are made of only an aluminum oxide layer.

The implied open-circuit voltages of the solar cells according to Embodiment 1 and Comparative Examples 1 and 2 are measured, and the results are shown in FIG. 12. Here, the implied open-circuit voltages are measured before the passivation layer formation, after the passivation layer formation, and after the electrode firing in the plurality of solar cells, and the average values thereof are shown together in FIG. 12.

Referring to FIG. 12, it can be seen that the implicit open-circuit voltage of the solar cell according to Embodiment 1 is greatly increased after the formation of the passivation layer and after the electrode firing compared to the solar cells according to Comparative Examples 1 and 2. This is expected because the passivation characteristics are improved by the first passivation layer including the first aluminum oxide layer and the first dielectric layer, and the second passivation layer including the second aluminum oxide layer and the second dielectric layer.

A photoluminescence (PL) photograph is taken by selecting a solar cell using a semiconductor substrate manufactured in the same or similar portion of an ingot from among the plurality of solar cells manufactured according to Embodiment 1 and Comparative Example 1, and the results are shown in FIGS. 13 and 14. Here, FIG. 13(a) shows a photoluminescence photograph after forming the first and second conductivity-type regions in Embodiment 1, and FIG. 13(b) shows a photoluminescence photograph after forming the first and second passivation layers in Embodiment 1. FIG. 14(a) shows a photoluminescence photograph after forming the first and second conductivity-type regions in Comparative Example 1, and FIG. 14(b) shows a photoluminescence photograph after forming the first and second passivation layers in Comparative Example 1.

As shown in FIG. 13(a), even when a ring pattern is provided in the photoluminescence photograph before the formation of the passivation layer in Embodiment 1, as shown in FIG. 13(b), it can be seen that a lot of the ring pattern have disappeared from the photoluminescence photograph after the formation of the passivation layer. In the photoluminescence photograph, the ring pattern is caused by an oxidation-induced stack fault (OISF), which is a type of defect, and in Embodiment 1, it can be seen that the ring pattern is greatly reduced after the formation of the passivation layer. Accordingly, it can be seen that the passivation characteristics can be improved by the formation of the passivation layer according to Embodiment 1. This is expected because the hydrogen implantation effect by the first aluminum oxide layer is maximized by the stacked structure of the first aluminum oxide layer and the first dielectric layer. On the other hand, as shown in (a) and (b) of FIG. 14, in Comparative Example 1, it can be seen that the ring pattern still exists even after the formation of the passivation layer.

The features, structures, effects and the like according to the above-described embodiments are included in at least one embodiment of the present disclosure, and are not necessarily limited to only one embodiment. Furthermore, the features, structures, effects, and the like illustrated in the embodiments may be combined or modified in other embodiments by those skilled in the art to which the embodiments belong. Accordingly, contents related to these combinations and modifications should be construed as being included in the scope of the present disclosure.

The invention claimed is:

1. A solar cell, comprising:
a semiconductor substrate;
a first conductivity-type region formed on a first surface of the semiconductor substrate and composed of a polycrystalline silicon layer having an n-type conductivity;
a first passivation layer including:
a first aluminum oxide layer positioned on the first conductivity-type region and having hydrogen, and
a first dielectric layer positioned on the first aluminum oxide layer and including a material different from the first aluminum oxide layer, wherein the material different from the first aluminum oxide layer includes silicon nitride, silicon oxide, or silicon oxynitride;
a first electrode electrically connected to the first conductivity-type region passing through the first passivation layer;
a second conductivity-type region formed at or on a second surface of the semiconductor substrate and having a p-type conductivity;
a second passivation layer including a second aluminum oxide layer positioned on the second conductivity-type region, and a second dielectric layer positioned on the second aluminum oxide layer and including a material different from the second aluminum oxide layer; and
a second electrode electrically connected to the second conductivity-type region passing through the second passivation layer,
wherein a first uneven portion is formed on the second surface of the semiconductor substrate; a second uneven portion is formed on the first uneven portion; and an average size of the second uneven portion is smaller than an average size of the first uneven portion;
wherein only the second conductivity-type region of the first conductivity-type region and the second conductivity-type region includes:
a first region formed in a portion corresponding to the second electrode and having a low resistance or a high doping concentration; and
a second region positioned in an other portion of the second conductivity-type region having a higher resistance or a lower doping concentration than the first region.

2. The solar cell of claim 1, wherein a thickness of the first aluminum oxide layer is less than a thickness of the first dielectric layer.

3. The solar cell of claim 1, further comprising:
a silicon oxide layer positioned between the first conductivity-type region and the first passivation layer.

4. The solar cell of claim 1, wherein
the first surface of the semiconductor substrate is a rear surface of the semiconductor substrate,
the first electrode includes a plurality of finger electrodes extending in one direction, and
the first dielectric layer functions as an anti-reflection film.

5. The solar cell of claim 1, wherein
the second conductivity-type region is composed of a doped region constituting a part of the semiconductor substrate, and
the first aluminum oxide layer and the second aluminum oxide layer have the same material, composition, and thickness.

6. A solar cell, comprising:
a semiconductor substrate;
a first conductivity-type region formed on a first surface of the semiconductor substrate and composed of a polycrystalline silicon layer having a first conductivity type;
a second conductivity-type region formed on a second surface of the semiconductor substrate and composed of a doped region having a second conductivity type;
a first passivation layer positioned on the first conductivity-type region;
a second passivation layer including a second aluminum oxide layer positioned on the second conductivity-type region, and a second dielectric layer positioned on the second aluminum oxide layer and including a material different from the second aluminum oxide layer;

a first electrode electrically connected to the first conductivity-type region passing through the first passivation layer; and
a second electrode electrically connected to the second conductivity-type region passing through the second passivation layer,
wherein the first and second passivation layers each include an aluminum oxide layer positioned on the first or second conductivity-type region and a dielectric layer positioned on the aluminum oxide layer and including a material different from the aluminum oxide layer that includes silicon nitride, silicon oxide, or silicon oxynitride,
wherein a first uneven portion is formed on the second surface of the semiconductor substrate; a second uneven portion is formed on the first uneven portion; and an average size of the second uneven portion is smaller than an average size of the first uneven portion,
wherein only the second conductivity-type region of the first conductivity-type region and the second conductivity-type region includes:
a first region formed in a portion corresponding to the second electrode and having a low resistance or a high doping concentration; and
a second region positioned in an other portion of the second conductivity-type region having a higher resistance or a lower doping concentration than the first region.

7. The solar cell of claim 6, wherein a thickness of the aluminum oxide layer is less than a thickness of the dielectric layer.

8. A method for manufacturing a solar cell, comprising:
forming a first conductivity-type region composed of a polycrystalline silicon layer having an n-type conductivity on a first surface of a semiconductor substrate;
forming a second conductivity-type region at or on a second surface of the semiconductor substrate;
forming a passivation layer including forming a first passivation layer on the first conductivity-type region and forming a second passivation layer on the second conductivity-type region; and
forming electrodes, which is forming a first electrode electrically connected to the first conductivity-type region by passing through the first passivation layer and forming a second electrode electrically connected to the second conductivity-type region by passing through the second passivation layer,
wherein the forming the first passivation layer includes a process of forming a first aluminum oxide layer having hydrogen on the first conductivity-type region, and a process of forming a first dielectric layer positioned on the first aluminum oxide layer and including a material different from the first aluminum oxide layer, wherein the material different from the first aluminum oxide layer includes silicon nitride, silicon oxide, or silicon oxynitride,
wherein before the forming the passivation layer, a first uneven portion is formed on the second surface of the semiconductor substrate, and a second uneven portion is formed on the first uneven portion; and an average size of the second uneven portion is smaller than an average size of the first uneven portion;
wherein the forming the second passivation layer includes a process of forming a second aluminum oxide layer on the second conductivity-type region, and a process of forming a second dielectric layer positioned on the second aluminum oxide layer and including a material different from the second aluminum oxide layer;
wherein only the second conductivity-type region of the first conductivity-type region and the second conductivity-type region includes:
a first region formed in a portion corresponding to the second electrode and having a low resistance or a high doping concentration; and
a second region positioned in an other portion of the second conductivity-type region having a higher resistance or a lower doping concentration than the first region.

9. The method of claim 8, wherein
hydrogen included in the first aluminum oxide layer is implanted into at least one of the first conductivity-type region and the semiconductor substrate by an annealing process performed in at least one of the forming the passivation layer and the forming the electrode.

10. The method of claim 8, wherein the process of forming the first aluminum oxide layer and the process of forming the second aluminum oxide layer are performed together by the same process.

11. The method of claim 8, wherein
in the forming the passivation layer, the process of the forming the first dielectric layer is performed after the process of forming the second dielectric layer is performed, and
the process of the forming the second dielectric layer includes a first annealing process in which hydrogen included in the first aluminum oxide layer is implanted into at least one of the first conductivity-type region and the semiconductor substrate.

12. The method of claim 11, wherein
after performing the first annealing process, a deposition process of the first dielectric layer is performed.

13. The method of claim 8, wherein the process of forming the first aluminum oxide layer is performed by an atomic layer deposition method or a plasma-induced chemical vapor deposition method.

14. The method of claim 8, wherein the process of the forming the electrode includes a second annealing process in which hydrogen included in the first aluminum oxide layer is implanted into at least one of the first conductivity-type region and the semiconductor substrate, and
the first dielectric layer functions as a capping layer that prevents external diffusion of hydrogen in the second annealing process.

15. The method of claim 8, wherein the first uneven portion and the second uneven portion are formed on the second surface of the semiconductor substrate by reactive ion etching.

16. The solar cell of claim 1, wherein a hydrogen content per unit volume in the first aluminum oxide layer is greater than a hydrogen content per unit volume in the first dielectric layer.

* * * * *